(12) United States Patent
Daniels et al.

(10) Patent No.: US 7,294,961 B2
(45) Date of Patent: Nov. 13, 2007

(54) PHOTO-RADIATION SOURCE PROVIDED WITH EMISSIVE PARTICLES DISPERSED IN A CHARGE-TRANSPORT MATRIX

(75) Inventors: John James Daniels, Higganum, CT (US); Gregory Victor Nelson, Branford, CT (US)

(73) Assignee: Articulated Technologies, LLC, Higganum, CT (US)

( * ) Notice: Subject to any disclaimer, the term of this patent is extended or adjusted under 35 U.S.C. 154(b) by 69 days.

(21) Appl. No.: 10/919,915

(22) Filed: Aug. 17, 2004

(65) Prior Publication Data

US 2005/0212406 A1     Sep. 29, 2005

Related U.S. Application Data

(60) Provisional application No. 60/556,959, filed on Mar. 29, 2004.

(51) Int. Cl.
 H05B 33/20   (2006.01)
 H05B 33/14   (2006.01)
 H01L 51/50   (2006.01)

(52) U.S. Cl. ............... 313/504; 313/503; 313/506; 428/690; 428/917

(58) Field of Classification Search ........... 313/503, 313/504, 506, 512; 428/690, 917
See application file for complete search history.

(56) References Cited

U.S. PATENT DOCUMENTS

| | | |
|---|---|---|
| 3,792,308 A | 2/1974 | Ota |
| 4,335,501 A | 6/1982 | Wickenden et al. |
| 4,495,514 A | 1/1985 | Lawrence et al. |
| 5,273,608 A | 12/1993 | Nath |
| 5,469,019 A | 11/1995 | Mori |
| 5,537,433 A | 7/1996 | Watanabe |
| 5,705,888 A | 1/1998 | Staring et al. |
| 5,757,138 A | 5/1998 | Tsai |
| 5,783,292 A | 7/1998 | Tokito et al. |

(Continued)

FOREIGN PATENT DOCUMENTS

WO     WO 92-06144    4/1992

OTHER PUBLICATIONS

Lee et al., Tae-Woo, "Organic Light-Emitting Diodes Formed by Soft Contact Lamination." *Proceedings of the National Academy of Sciences (PNAS)*, vol. 101, No. 2 (Jan. 13, 2004): pp. 429-433.

(Continued)

*Primary Examiner*—Mariceli Santiago
(74) *Attorney, Agent, or Firm*—Michaud-Duffy Group LLP

(57) ABSTRACT

A photo-radiation source for the selective polymerization of photo-radiation-curable organic material. In a first embodiment, a first electrode is provided with a second electrode disposed adjacent to the first electrode, and defining a gap therebetween. A photo-radiation emission layer is disposed in the gap. The photo-radiation emission layer includes a charge-transport matrix material and an emissive particulate dispersed within the charge-transport matrix material. The emissive particulate receives electrical energy through the charge-transport matrix material applied as a voltage to the first electrode and the second electrode photo-radiation. The emissive particulate generates photo-radiation in response to the applied voltage. This photo-radiation is effective for the selective polymerization of photo-radiation curable organic material.

32 Claims, 30 Drawing Sheets

U.S. PATENT DOCUMENTS

| | | | |
|---|---|---|---|
| 5,800,478 A | 9/1998 | Chen et al. | |
| 5,858,561 A | 1/1999 | Epstein et al. | |
| 5,869,350 A | 2/1999 | Heeger et al. | |
| 5,882,806 A | 3/1999 | Mori | |
| 5,925,897 A | 7/1999 | Oberman | |
| 5,965,979 A | 10/1999 | Friend | |
| 5,991,456 A | 11/1999 | Rahman et al. | |
| 5,994,205 A | 11/1999 | Yamamoto et al. | |
| 6,087,196 A | 7/2000 | Sturm | |
| 6,091,382 A * | 7/2000 | Shioya et al. | 345/76 |
| 6,117,567 A | 9/2000 | Andersson et al. | |
| 6,252,564 B1 | 6/2001 | Albert | |
| 6,290,713 B1 | 9/2001 | Russell | |
| 6,307,751 B1 | 10/2001 | Bodony | |
| 6,340,824 B1 | 1/2002 | Komoto et al. | |
| 6,397,328 B1 | 5/2002 | Pitchenik et al. | |
| 6,402,579 B1 | 6/2002 | Pichler | |
| 6,416,885 B1 | 7/2002 | Towns | |
| 6,420,200 B1 | 7/2002 | Yamazaki | |
| 6,422,687 B1 | 7/2002 | Jacobson | |
| 6,433,355 B1 | 8/2002 | Riese et al. | |
| 6,445,126 B1 | 9/2002 | Arai et al. | |
| 6,607,413 B2 | 8/2003 | Stevenson et al. | |
| 6,737,799 B1 | 5/2004 | Lih et al. | |
| 6,762,069 B2 | 7/2004 | Huang et al. | |
| 6,876,143 B2 | 4/2005 | Daniels | |
| 6,936,131 B2 | 8/2005 | McCormick et al. | |
| 2003/0032361 A1 * | 2/2003 | Murasko et al. | 445/24 |
| 2003/0189402 A1 | 10/2003 | Gaudiana et al. | |
| 2003/0192584 A1 | 10/2003 | Beckenbaugh et al. | |
| 2004/0110866 A1 | 6/2004 | Irvin et al. | |
| 2004/0130045 A1 | 7/2004 | Bayless | |
| 2004/0195576 A1 | 10/2004 | Watanabe et al. | |
| 2005/0045851 A1 | 3/2005 | He et al. | |
| 2005/0282307 A1 * | 12/2005 | Daniels | 438/82 |

OTHER PUBLICATIONS

Dabbousi et al., O.D., "Electrode Lumeniscent from CdSe Quantum-dot/Polymer Composites," *Applied Physics Letters*, 66(11) (Mar. 13, 1995).

Land, Edwin, "An Alternative Technique for the Computation of the Designator in the Retinex Theory of Color Vision." *Proceedings of the National Academy of Science*, vol. 83 (1986): pp. 3078-3080.

Land, Edwin, "Color Vision and The Natural Image." *Proceedings of the National Academy of Science*, vol. 45 (1959): pp. 115-129.

Soppimath et al., K.S., "Biodegradable Polymeric Nanoparticles as Drug Delivery Devices," *Journal of Controlled Release*, vol. 70 (2001): pp. 1-20.

Collins, Graham P., "Liquid-Crystal Holograms Form Photonic Crystals," *Scientific American* (2003).

Kang, et al., Solid polymer electrolytes based on cross-linked polysiloxane-g-oligo (ethylene oxide): ionic conductivity and electrochemical properties,Journal of Power Source.

Sotzing et al., Poly(thieno[3,4-b]thiophene):A p- and n-Dopable Polythiophene Exhibiting High Optical Transparency in the Semiconducting State, 7281 Macromolecules 2002.

* cited by examiner solid state electrolyte charge transport carrier solid state conductor
adhesive, CTC, SSE
insulator (polymer, etc.)

solid state conductor adhesive, CTC, SSE
RGB pattern
structure can include conductive adhesives, non-conductive adhesives, combinations convex lens system concave lens system magnetically attractive chip electrode

Figure 23
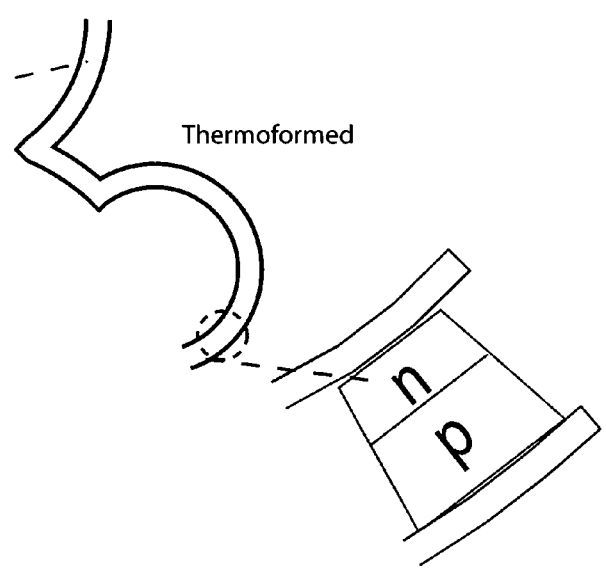
Thermoformed
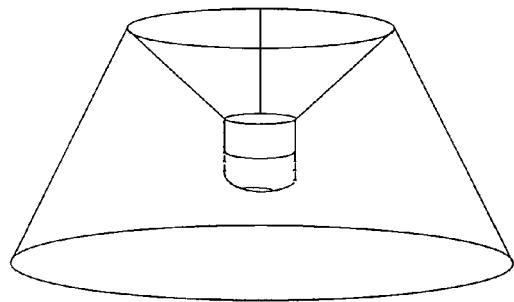
Figure 24(a)
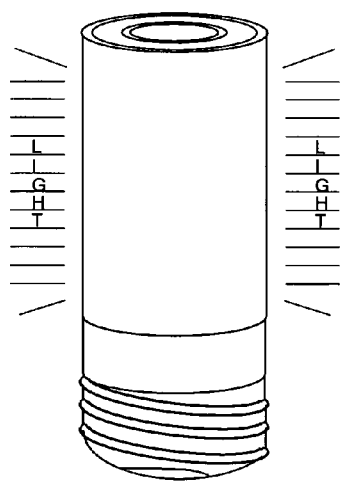
Figure 24(b)
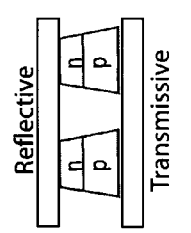
Figure 25

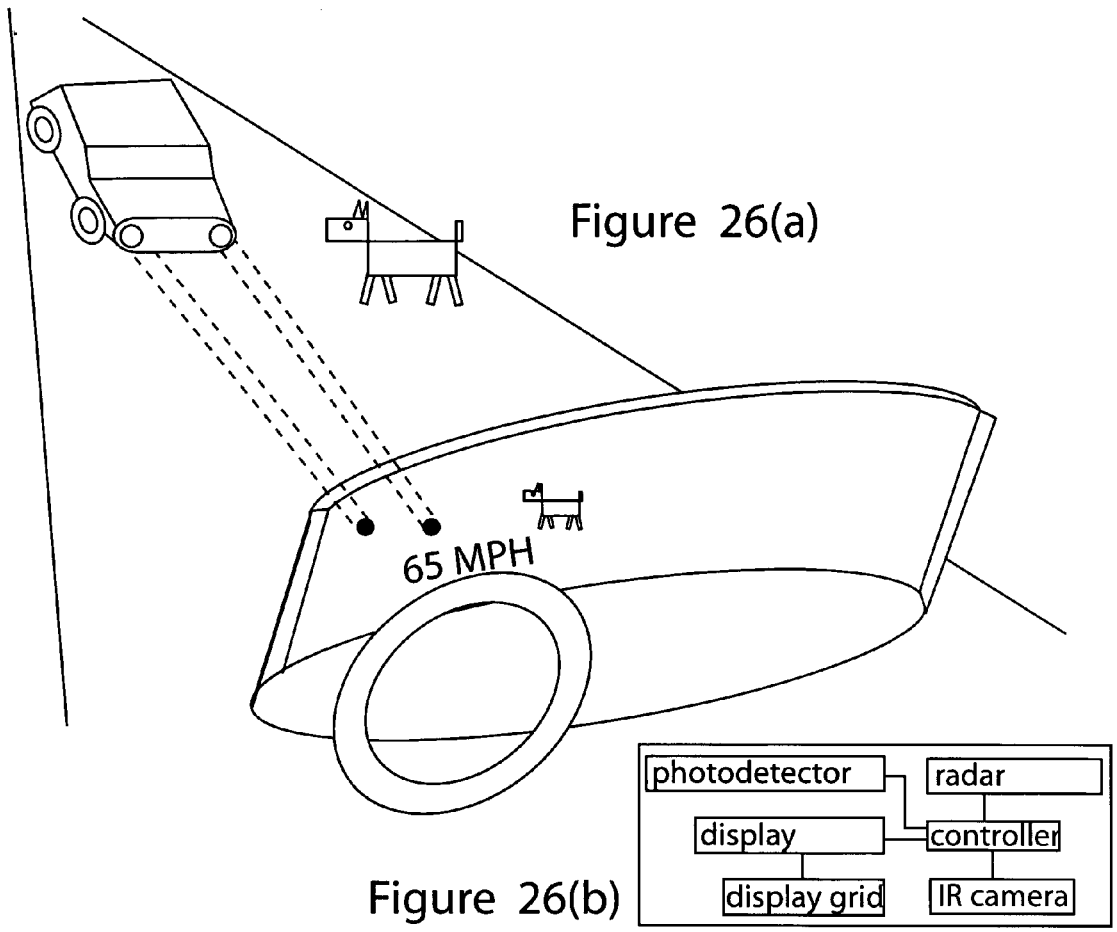
Figure 26(a)
Figure 26(b)
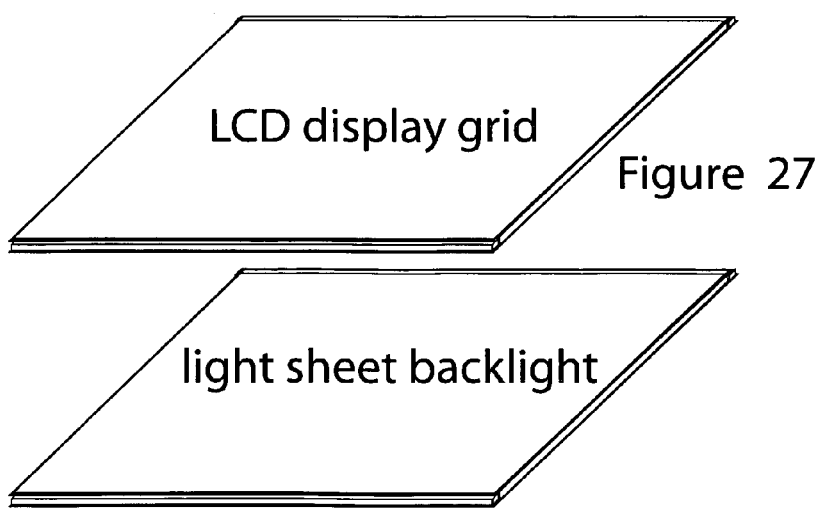
Figure 27

1) doctor blade the particle/matrix 2) apply top substrate 3) polymerize matrix 4) trim to remove edge effects 5) completed panel

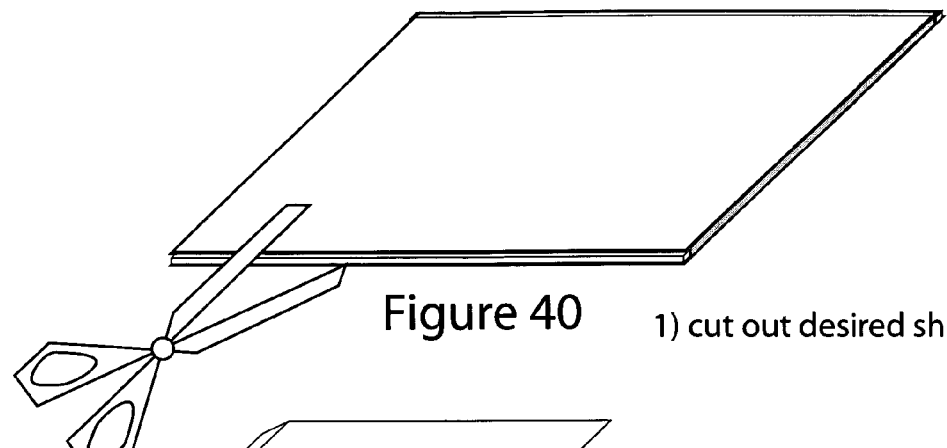
Figure 40  1) cut out desired shape
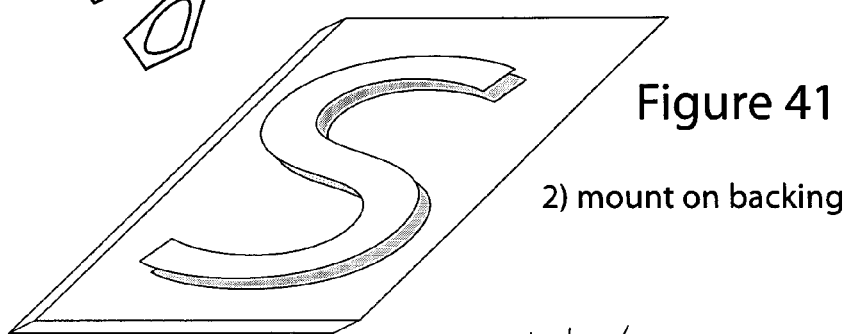
Figure 41
2) mount on backing board
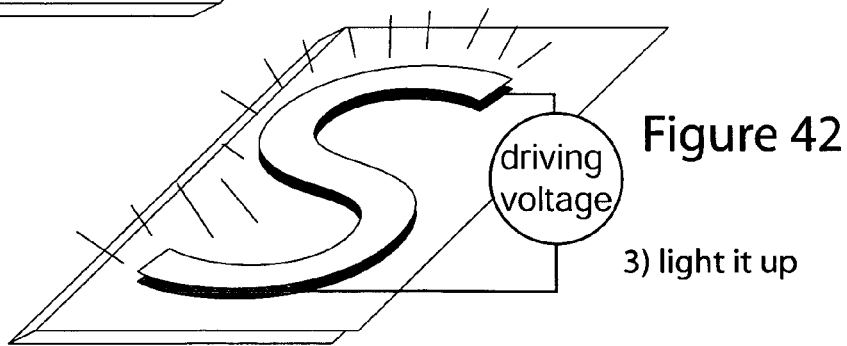
Figure 42
3) light it up
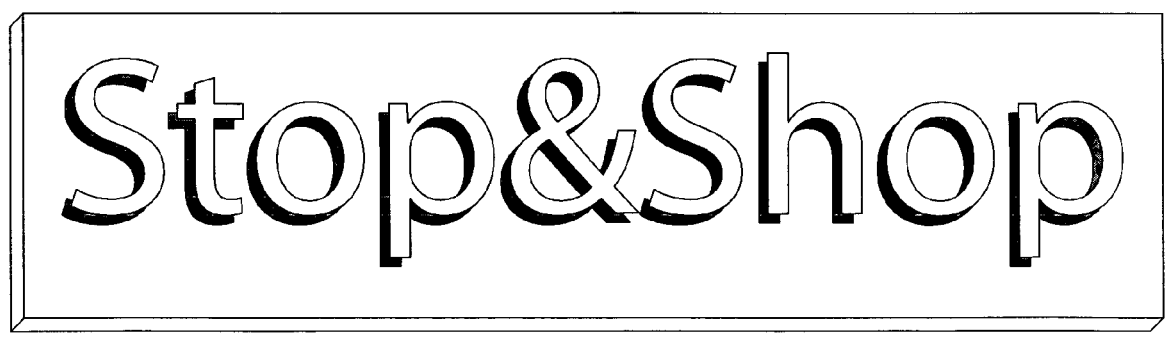
Figure 43

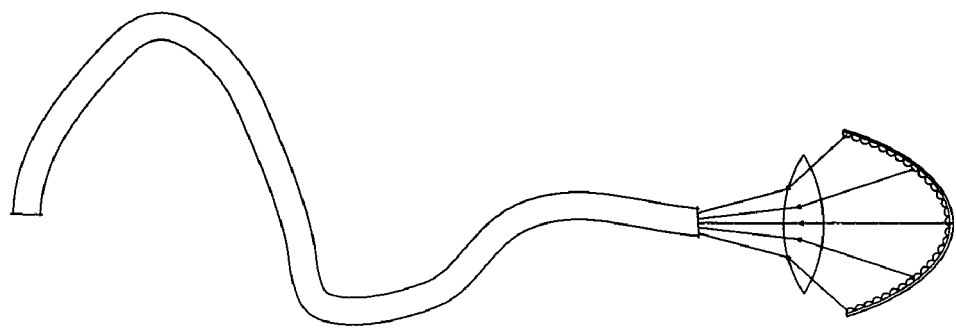
Figure 46
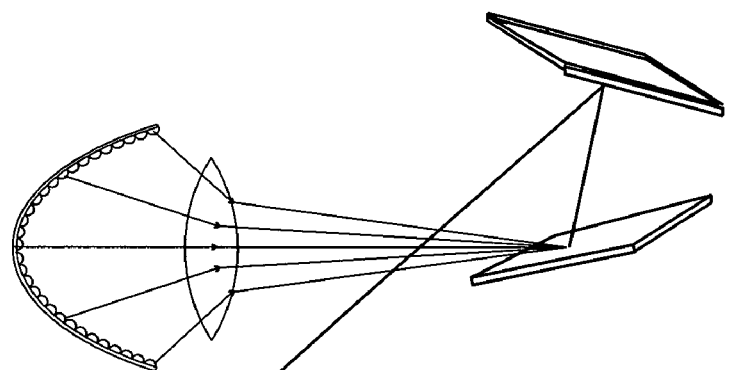
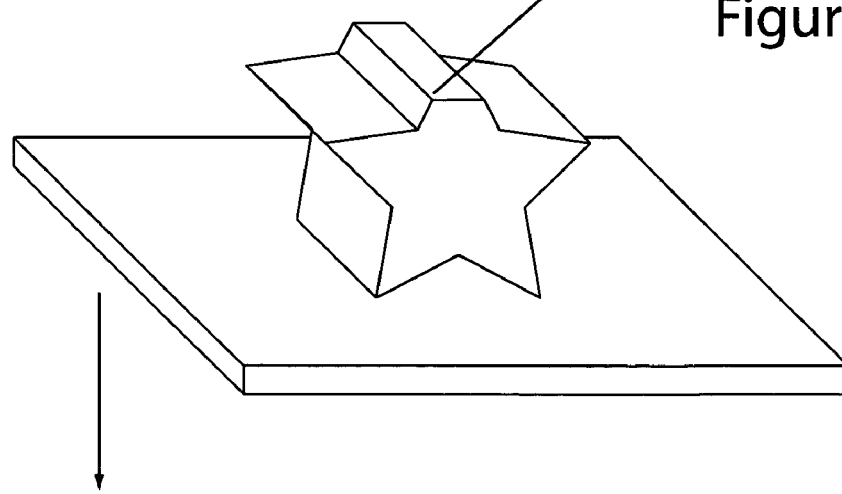
Figure 47

10 mW/chip at 4 volts

In a square cm, 400 chips are arranged in formation. Each chip's output is 10 mW/chip at 4 volts. The total output of the formation is 4 W/cmsq cooling channels heat sink Continuous UV Light Device direction of substrate motion uncured UV-curable adhesive continuous high intensity UV cure zone cured UV-curable adhesive

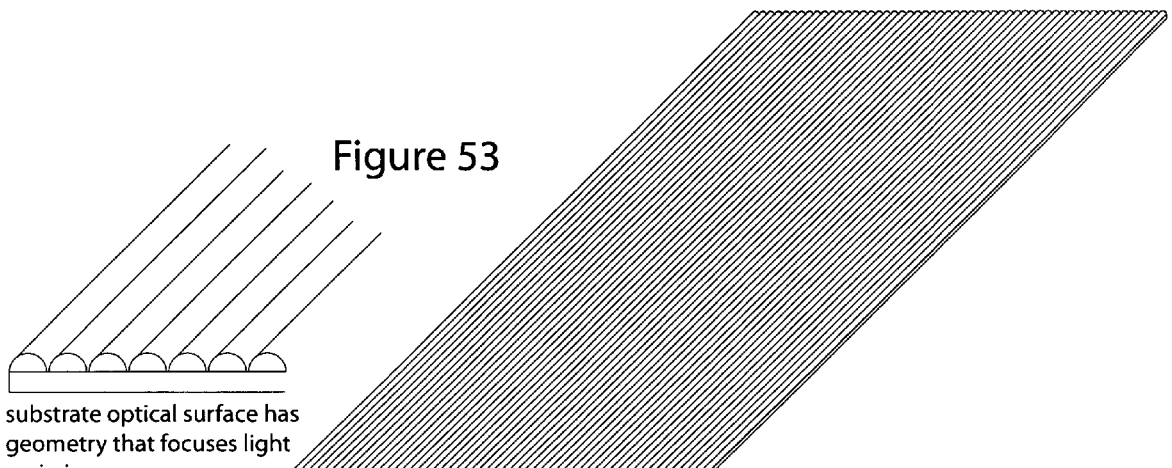
Figure 53
substrate optical surface has geometry that focuses light emission
roll-to-roll flat thin LED chip/matrix light panel
Figure 54
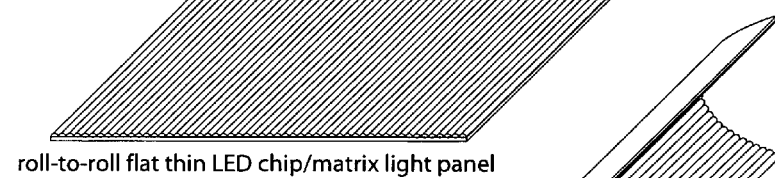
Figure 55
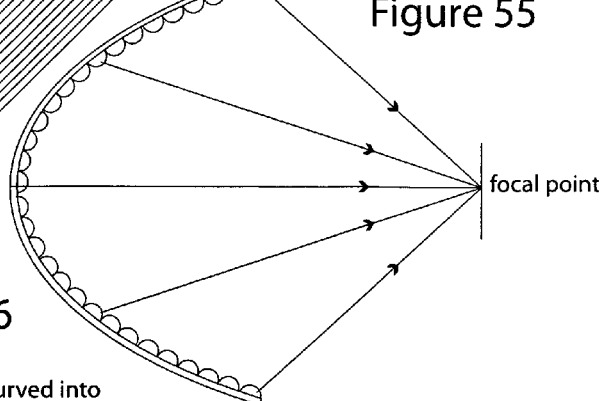
focal point
Figure 56
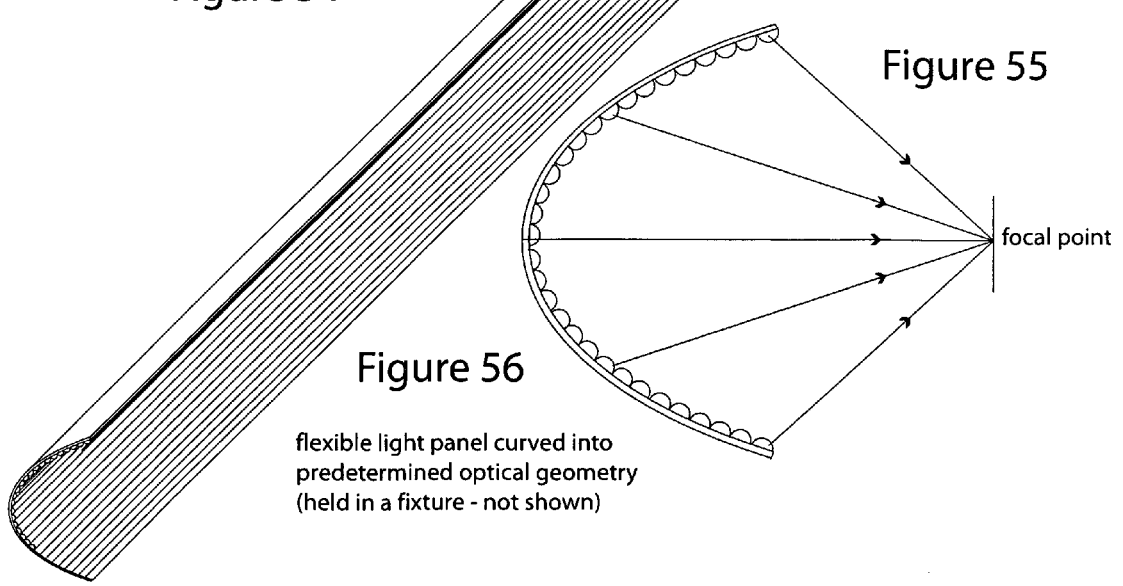
flexible light panel curved into predetermined optical geometry (held in a fixture - not shown)

chips aligned, oriented and positioned in front of optics curvature of substrate can be altered emissive surface area, and thus output intensity, can be increased by changing the shape of the curved light panel

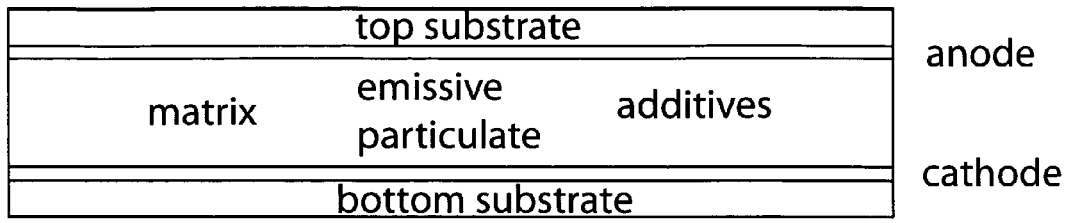

top substrate/anode: ITO coated polyester   Figure 62 bottom substrate/cathode: aluminum foil adhered to mylar
or metalized mylar with adhesive removed matrix: PEO-based electrolyte* emissive particulate: tyntek AlGaAs/AlGaAs Red Chip-TK 112UR

* transparent, good conductivity, photopolymerizable
see, Solid Polymer Electrolytes based on cross-linked
polysiloxane-g-oglio9ethylene oxide): ionic conductivity
and electrochemical properties

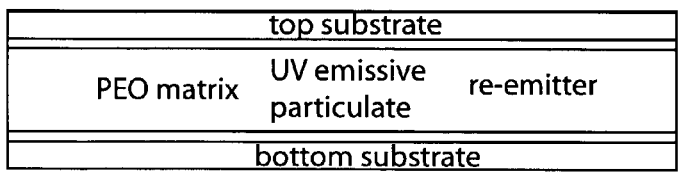

Figure 63 top substrate/anode: FEP*
anode material: ITO spray coated**
bottom substrate/cathode: aluminum foil adhered to mylar
or metalized mylar with adhesive removed or silver coated PET matrix: PEO-based solid polymer electrolyte (or new SPE that does
is transmissive to UV)

emissive particulate: Cree C405-MB290-S0100 or other UV LED Chip additives: light diffusion particles/glass dust (if necessary)

* flouroethylenepropylen:
high UV transmission
available from Adtech Poymer Engineering

**see, Low-Cost Deposition of Highly-
Conductive Indium-Tin-Oxide Transparent
Films by Chemical Process; Spray CVD
and Dip Coating

| | substrate coating |
|---|---|
| top substrate | anode |
| matrix   emissive particulate   additives | |
| bottom substrate | cathode | top substrate/anode: ITO coated polyester
substrate coating: light diffuser/re-emitter (e.g., phosphors)
bottom substrate/cathode: examples, aluminum foil adhered to mylar
or metalized mylar or silver coated PET

Figure 64 matrix: PEO-based solid polymer electrolyte (or new SPE that does
is transmissive to UV)
emissive particulate: Cree C405-MB290-S0100 or other UV LED Chip ⎤
additive: YAG (Yttrium Aluminum Garnet) phosphor                    ⎦ emissive particulate:  red LED chips    ⎤
                       green LED chips  ⎬
                       blue LED chips   ⎦

| | anode |
|---|---|
| top substrate | YAG layer |
| matrix   blue and yellow emissive particulate   light diffusers | |
| bottom substrate | cathode |

Figure 65

PHOTO-RADIATION SOURCE PROVIDED WITH EMISSIVE PARTICLES DISPERSED IN A CHARGE-TRANSPORT MATRIX

CROSS-REFERENCE TO RELATED APPLICATIONS

This is a U.S. Utility Application of U.S. Provisional Application Ser. No. 60/556,959, filed Mar. 29, 2004. This application also relates to U.S. Utility Application Ser. No. 10/920,010 entitled Light Active Sheet Material filed Aug. 17, 2004 and U.S. Utility Application Ser. No. 10/919,830 entitled Light Active Sheet Material And Methods For Making The Same, filed Aug. 17, 2004, the subject matter of these patent documents is incorporated by reference herein in its entirety.

BACKGROUND OF THE INVENTION

The present invention pertains to an inorganic light emitting diode light sheet and methods for manufacturing the same. More particularly, the present invention pertains to an inorganic light emitting diode light sheet that can be used as a photo-radiation source for applications including, but not limited to, general illumination, architectural lighting, novelty lighting, display backlighting, heads-up displays, commercial and roadway signage, monochromatic and full-color static and video displays, radiation-source for photo-curable materials, patterned light emissive images, and the like. Further, the present invention pertains more particularly to an inorganic light active sheet that can be used as a light-to-energy device for converting photo-radiation to electrical energy for applications including, but not limited to, solar panels, CCD-type cameras, photo-sensors, and the like. Further, the present invention pertains more particularly, to methods for mass-producing the inventive light active sheet at relatively low cost.

Inorganic light emitting diodes (LED) are based on elements of the periodic table of a vast variety. They come out of semiconductor technology, and indeed, a semiconductor diode such as a silicon diode, or a germanium diode were among the first semiconductor devices. These were made by doping the silicon or the germanium with a small amount of impurity to make n-type (excess electrons) or p-type (excess holes) in the material. LEDs emit light because of the materials selected so that the light is emitted in the ultraviolet, visible, or infrared ranges of the spectrum. The types of materials used are made from vapor deposition of materials on semiconductor wafers and cut into dice (a single one is a die). Typically, the die, or LED chips, are about 12 mil sq. The composition of the chips depends on the color, for example some red chips are AlInGaAs and some blue chips are InGaN. The variations are typically "three-five" variations, so-called because they vary based on the third and fifth period of the periodic table to provide the n- and p-type materials.

The conversion of an LED chip into an LED lamp is a costly process, involving very precise handling and placement of the tiny LED chip. The LED chips are most simply prepared as 3 mm LED lamps. The chip is robotically placed in a split cup with electrodes on each side. The entire structure is encased in a plastic lens that attempts to focus the beam more narrowly. High brightness chips may also be surface mounted with current-driving and voltage limiting circuits, and elaborate heat sink and heat removal schemes. Connection is by soldering or solderless ultrasonic wire bond methods. The result is a discrete point source of light. The LED lamp has a pair of leads, which can then be soldered to a printed circuit board. The cost of forming the lamp and then soldering the lamp to a printed circuit board is a relatively expensive process. Accordingly, there is a need to reduce the cost of forming a light emitting device based on the LED chip.

As an example application of LED lamps, it has recently been shown that ultraviolet LED lamps can be used to cure photo-polymerizable organic materials (see, for example, Loctite® 7700 Hand Held LED Light Source, Henkel-Loctite Corporation, Rocky Hill, Conn.

Photo-polymerizable organic materials are well known and are used for applications such as adhesives, binders and product manufacturing. Photo-polymerization occurs in monomer and polymer materials by the cross-linking of polymeric material. Typically, these materials are polymerized using radiation emitted from sources of light including intensity flood systems, high intensity wands, chambers, conveyors and unshielded light sources.

As an example use of photo-polymerizable organic materials, precision optical bonding and mounting of glass, plastics and fiber optics can be obtained with photo-polymerizable adhesives. These materials can be used for opto-mechanical assembly, fiber optic bonding and splicing, lens bonding and the attachment of ceramic, glass, quartz, metal and plastic components.

Among the drawbacks of the conventional systems that utilize photo-polymerizable organic materials is the requirement of a high intensity photo-radiation source. Typically, light sources, such as mercury vapor lamps, have been used to generate the radiation needed for photo-polymerization. However, these light sources are an inefficient radiation source because most of the energy put in to drive the lamp is wasted as heat. This heat must be removed from the system, increasing the overall bulk and cost. Also, the lamps have relatively short service life-times, typically around 1000 hours, and are very costly to replace. The light that is output from these light sources usually covers a much broader spectrum than the photo-radiation wavelengths that are needed for photo-polymerization. Much of the light output is wasted. Also, although the material can be formulated to be hardened at other wavelengths, the typical photo-polymerizable organic material is hardened at one of the peak output wavelengths of the mercury vapor lamp, to increase the polymerization efficiency. This peak output wavelength is in the UV region of the radiation spectrum. This UV radiation is harmful to humans, and additional shielding and protective precautions such as UV-filtering goggles are needed to protect the operators of such equipment.

FIG. 66 is a side view of an inorganic LED chip available. A conventional inorganic LED chip is available from many manufacturers, typically has a relatively narrow radiation emission spectrum, is relatively energy efficient, has a long service life and is solid-state and durable. The chip shown is an example of an AlGaAs/AlGaAs red chip, obtained from Tyntek Corporation, Taiwan. These chips have dimensions roughly 12 mil×12 mil×8 mil, making them very small point light sources. As shown in FIG. 67, in a conventional LED lamp, this chip is held in a metal cup so that one electrode of the chip (e.g., the anode) is in contact with the base of the cup. The metal cup is part of a cathode lead. The other electrode of the chip (e.g., the cathode) has a very thin wire solder or wiring bonding to it, with the other end of the wire solder or wiring bonding to an anode lead. The cup, chip, wire and portions of the anode and cathode leads are encased in a plastic lens with the anode and cathode leads protruding from the lens base. These leads are typically solder or wire bonded to a circuit board to selectively provide power to the chip and cause it to emit light. It is very difficult to manufacture these conventional lamps due to the very small size of the chip, and the need to solder or wire bond such a small wire to such a small chip electrode. Further, the plastic lens material is a poor heat conductor and the cup provides little heat sink capacity. As the chip heats up its efficiency is reduced, limiting the service conditions, power efficiency and light output potential of the lamp. The bulkiness of the plastic lens material and the need to solder or wire bond the lamp leads to an electrical power source limits emissive source packing density and the potential output intensity per surface area.

There is a need for a photo-radiation source that is energy efficient, generates less heat, is low cost and that has a narrow spectrum of radiation emission. There have been attempts to use inorganic light emitting diode lamps (LEDs) as photo-radiation sources. Usually, these LEDs are so-called high brightness UV radiation sources. A typical LED consists of a sub-millimeter sized chip of light emitting material that is electrically connected to an anode lead and a cathode lead. The chip is encased within a plastic lens material. However, the processing that takes the LED chips and turns it into an LED lamp is tedious and sophisticated, mostly due to the very small size of the LED chip. It is very difficult to solder or wire bond directly to the chips, and so it is common practice to use LED lamps that are then solder or wire bonded onto a circuit board. Conventionally, UV LED lamps have been solder or wire bonded onto a circuit board in a formation to create a source of photo-radiation for photo-polymerizable organic materials.

This solution is far from optimum, since the relatively high cost of the LED lamps keeps the overall cost of the photo-radiation source high. There is a need for a photo-radiation source that can use the LED chips directly, without the need for the lamp construction or a direct solder or wire bonded connection between the anode and cathode of the chip. Such as system would have an efficient chip packing density, enabling a high-intensity photo-radiation source having a narrow emission band.

SUMMARY OF THE INVENTION

The present invention is intended to overcome the drawbacks of the prior art. It is an object of the present invention to provide methods for manufacturing solid-state light active devices. It is another object of the present invention to provide device structures for solid-state light active devices. It is still another object of the present invention to provide a photo-radiation source for the selective polymerization of photo-radiation-curable organic material.

In accordance with an aspect of the invention, a method is provided for forming a sheet of light active material. A first substrate is provided having a transparent first conductive layer. A pattern of light active semiconductor elements are formed. The light active semiconductor elements have an n-side and a p-side. Each light active semiconductor element has either of the n-side or the p-side in electrical communication with the transparent conductive layer. A second substrate having a second conductive layer is provided. The second substrate is secured to the first substrate so that the other of said n-side or said p-side of each said light active semiconductor element in electrical communication with the second conductive layer. Thus, a solid-state sheet of light active material is formed.

The transparent first conductive layer may comprise a transparent coating preformed on the first substrate. The transparent coating can be applied as a conductive ink or conductive adhesive.

The pattern of light active semiconductor elements can be formed by electrostatically attracting the light active semiconductor elements to a transfer member. Then, transferring the attracted light active semiconductor elements from the transfer member to the first substrate. The transfer member may include an opto-electric coating effective for holding a patterned electrostatic charge. The patterned electrostatic charge is effective for electrostatically attracting the light active semiconductor elements and forming the pattern of light active semiconductor elements. The optical patterning of the opto-electric coating can be done, for example, using a scanned laser beam and an LED light source, similar to the process used by laser or LED printers. Thus, the transfer member may comprise a drum.

An adhesive pattern can be formed on the first substrate for adhering the pattern of light active semiconductor elements to the first substrate. Alternatively, or additionally, an adhesive pattern can also be formed on the first substrate for adhering the second substrate to the first substrate.

A pattern of light active semiconductor elements can be formed by forming a first pattern of first light active semiconductor elements and forming a second pattern of second light active semiconductor elements. The first light active semiconductor elements emit light having a first color and the second light active semiconductor elements emit light having a second color. Alternatively, the first light active semiconductor elements emit light and the second light active semiconductor elements convert light to electrical energy.

The first conductive layer may be formed as a grid of x-electrodes, and the second conductive layer formed as a grid of y-electrodes, so that each respective light active semiconductor element is addressable for forming a sheet of light active material capable of functioning as a pixilated display component.

The pattern of light active semiconductor elements can be formed by forming a first pattern of first color light emitting semiconductor elements, forming a second pattern of second color light emitting semiconductor elements and forming a third pattern of third color light emitting semiconductor element. The first conductive layer may be formed as a grid of x-electrodes, and the second conductive layer formed as a grid of y-electrodes, so that each respective light active semiconductor is addressable for forming a sheet of light active material capable of functioning as a full-color pixilated display component.

In accordance with another aspect of the invention, a method is provided for forming a light-emitting device. A first substrate is provided. A first conductive surface is formed on the first substrate. A pattern of LED chips is formed on the conductive pattern. Each LED chip has an anode and a cathode side. A second substrate is provided. A second conductive surface is formed on the second substrate. The first substrate is fixed to the second substrate so that either of the anode and the cathode side of the LED chip is in electrical communication with the first conductive surface, and the other of the anode and the cathode side of the LED chips is in electrical communication with the second conductive surface.

The first conductive surface may be formed as a conductive pattern comprised of at least one of a conductive coating, a conductive ink and a conductive adhesive. At least one of the first and the second conductive surface is a transparent conductor. At least one of the first and the second conductive surface is preformed on the respective first and second substrate. The first conductive surface can be formed using a printing method. The printing method may comprise at least one of an inkjet printing method, a laser printing method, a silk-screen printing method, a gravure printing method and a donor transfer sheet printing method.

An adhesive layer may be formed between the top substrate and the bottom substrate. The adhesive layer may comprise at least one of a conductive adhesive, a semi-conductive adhesive, an insulative adhesive, a conductive polymer, a semi-conductive polymer, and an insulative polymer. A function-enhancing layer can be formed between the top substrate layer and the bottom substrate layer. The function-enhancing layer includes at least one of a re-emitter, a light-scatterer, an adhesive, and a conductor.

The pattern of LED chips can be formed by electrostatically attracting the LED chips to a transfer member, and then transferring the attracted LED chips from the transfer member to the first conductive surface. The transfer member may include an opto-electric coating effective for holding a patterned electrostatic charge, the patterned electrostatic charge being effective for electrostatically attracting and forming the pattern of LED chips.

The the opto-electric coating can be patterned using at least one of a scanned laser beam and an LED light source. The transfer member may be a drum, a flat planar member, or other shape.

In accordance with another aspect of the invention, a method is provided for forming a light-to-energy device. A first substrate is provided. A first conductive surface is formed on the first substrate. A pattern of semiconductor elements is formed on the conductive pattern. Each semiconductor element comprises a charge donor side and a charge acceptor side. A second substrate is provided. A second conductive surface is formed on the second substrate. The first substrate is fixed to the second substrate so that either of the charge donor and the charge acceptor side of the semiconductor elements is in electrical communication with the first conductive surface and the other of the charge donor and the charge acceptor side of the semiconductor elements is in electrical communication with the second conductive surface.

The first conductive surface is formed as a conductive pattern comprised of at least one of a conductive coating, a conductive ink and a conductive adhesive. At least one of the first and the second conductive surface is a transparent conductor. At least one of the first and the second conductive surface is preformed on the respective first and second substrate. The first conductive surface may be formed using a printing method. The printing method may comprise at least one of an inkjet printing method, a laser printing method, a silk-screen printing method, a gravure printing method and a donor transfer sheet printing method.

An adhesive layer can be formed between the top substrate and the bottom substrate. The adhesive layer may comprise at least one of a conductive adhesive, a semi-conductive adhesive, an insulative adhesive, a conductive polymer, a semi-conductive polymer, and an insulative polymer. A function-enhancing layer can be formed between the top substrate layer and the bottom substrate layer, wherein the function-enhancing layer includes at least one of a re-emitter, a light-scatterer, an adhesive, and a conductor.

The pattern of LED chips can be formed by electrostatically attracting the LED chips to a transfer member, and then transferring the attracted LED chips from the transfer member to the first conductive surface. The transfer member may include an opto-electric coating effective for holding a patterned electrostatic charge, the patterned electrostatic charge being effective for electrostatically attracting and forming the pattern of LED chips. The opto-electric coating can be patterned using at least one of a scanned laser beam and an LED light source. The transfer member may be shaped as a drum, a flat planar member, or other shape.

In accordance with another aspect of the invention, device structures are provide for sheets of light active material. A first substrate has a transparent first conductive layer. A pattern of light active semiconductor elements fixed to the first substrate. The light active semiconductor elements have an n-side and a p-side. Each light active semiconductor element has either of the n-side or the p-side in electrical communication with the transparent conductive layer. A second substrate has a second conductive layer. An adhesive secures the second substrate to the first substrate so that the other of said n-side or said p-side of each said light active semiconductor element is in electrical communication with the second conductive layer. Thus, a solid-state light active device is formed.

The transparent first conductive layer may comprise a transparent coating preformed on the first substrate. The transparent coating can be a conductive ink or conductive adhesive. An adhesive pattern may be formed on the first substrate for adhering the pattern of light active semiconductor elements to the first substrate. Alternatively, or additionally, an adhesive pattern may be formed on the first substrate for adhering the second substrate to the first substrate.

The pattern of light active semiconductor elements may comprise a first pattern of first light active semiconductor elements and a second pattern of second light active semiconductor elements. The first light active semiconductor elements may emit light having a first color and the second light active semiconductor elements emit light having a second color. Alternatively, the first light active semiconductor elements may emit light and the second light active semiconductor elements convert light to electrical energy.

The first conductive layer may be formed as a grid of x-electrodes, and the second conductive layer formed as a grid of y-electrodes. Each respective light active semiconductor element is disposed at the respective intersections of the x and y grid and are thus addressable for forming a sheet of light active material capable of functioning as a pixilated display component.

The pattern of light active semiconductor elements may comprise a first pattern of first color light emitting semiconductor elements, a second pattern of second color light emitting semiconductor elements and a third pattern of third color light emitting semiconductor element. The first conductive layer may be formed as a grid of x-electrodes, and the second conductive layer being formed as a grid of y-electrodes. The respective first, second and third color light emitting elements may be disposed at the intersections of the x and y grid so that each respective light active semiconductor is addressable. Thus, a sheet of light active material is formed capable of functioning as a full-color pixilated display component.

In accordance with another aspect of the invention, a light-emitting device comprises a first substrate. A first conductive surface is formed on the first substrate. A pattern of LED chips is formed on the conductive pattern. Each LED chip has an anode and a cathode side. A second substrate has a second conductive surface formed on it. An adhesive fixes the first substrate to the second substrate so that either of the anode and the cathode side of the LED chip is in electrical communication with the first conductive surface, and the other of the anode and the cathode side of the LED chips is in electrical communication with the second conductive surface.

The first conductive surface can be formed as a conductive pattern comprised of at least one of a conductive coating, a conductive ink and a conductive adhesive. At least one of the first and the second conductive surface is a transparent conductor. At least one of the first and the second conductive surface can be preformed on the respective first and second substrate. The first conductive surface can be formed using a printing method. The printing method may comprise at least one of an inkjet printing method, a laser printing method, a silk-screen printing method, a gravure printing method and a donor transfer sheet printing method.

The adhesive layer can comprise at least one of the top substrate and the bottom substrate. The adhesive layer can comprise at least one of a conductive adhesive, a semi-conductive adhesive, an insulative adhesive, a conductive polymer, a semi-conductive polymer, and an insulative polymer. A function-enhancing layer can be formed between the top substrate layer and the bottom substrate layer. The function-enhancing layer may include at least one of a re-emitter, a light-scatterer, an adhesive, and a conductor.

In accordance with another aspect of the invention, a light-to-energy device comprises a first substrate. A first conductive surface is formed on the first substrate. A pattern of semiconductor elements is formed on the conductive pattern. Each semiconductor element includes a charge donor layer side and a charge acceptor side. A second substrate is provided having a second conductive surface formed on it. An adhesive fixes the first substrate to the second substrate so that either of the charge donor and the charge acceptor side of the semiconductor elements is in electrical communication with the first conductive surface, and the other of the charge donor and the charge acceptor side of the semiconductor elements is in electrical communication with the second conductive surface.

The first conductive surface may be formed as a conductive pattern comprised of at least one of a conductive coating, a conductive ink and a conductive adhesive. At least one of the first and the second conductive surface is a transparent conductor. At least one of the first and the second conductive surface may be preformed on the respective first and second substrate. The adhesive may comprise at least one of the top substrate and the bottom substrate. The adhesive layer may comprise at least one of a conductive adhesive, a semi-conductive adhesive, an insulative adhesive, a conductive polymer, a semi-conductive polymer, and an insulative polymer.

In accordance with another aspect of the present invention, the photo-radiation source includes a first electrode with a second electrode disposed adjacent to the first electrode, and defining a gap therebetween. A photo-radiation emission layer is disposed in the gap. The photo-radiation emission layer includes a charge-transport matrix material and an emissive particulate dispersed within the charge-transport matrix material. The emissive particulate receives electrical energy through the charge-transport matrix material applied as a voltage to the first electrode and the second electrode photo-radiation. The emissive particulate generates photo-radiation in response to the applied voltage. This photo-radiation is effective for the selective polymerization of photo-radiation curable organic material.

The charge-transport matrix material may be an ionic transport material, such as a fluid electrolyte or a solid electrolyte, including a solid polymer electrolyte (SPE). The solid polymer electrolyte may be a polymer electrolyte including at least one of a polyethylene glycol, a polyethylene oxide, and a polyethylene sulfide. Alternatively or additionally, the charge-transport matrix material may be an intrinsically conductive polymer. The intrinsically conductive polymer may include aromatic repeat units in a polymer backbone. The intrinsically conductive polymer may be, for example, a polythiophene.

In accordance with another aspect of the present invention, a photo-radiation source is provided for the selective polymerization of photo-radiation-curable organic material. A plurality of light emitting diode chips generate a photo-radiation spectrum effective for the selective polymerization of photo-radiation-curable organic material. Each chip has an anode and a cathode. A first electrode is in contact with each anode of the respective light emitting diode chips. A second electrode is in contact with each cathode of the respective light emitting diode chips. At least one of the first electrode and the second electrode comprises a transparent conductor. The plurality of chips are permanently fixed in a formation by being squeezed between the first electrode and the second electrode without the use of solder or wire bonding. The plurality of chips are permanently fixed in a formation by being adhered to at least one of the first electrode and the second electrode using a conductive adhesive, for example, the conductive adhesive can be a metallic/polymeric paste, an intrinsically conjugated polymer, or other suitable material. The intrinsically conjugated polymer may comprise a benzene derivative. The intrinsically conjugated polymer may comprise a polythiophene. In accordance with this embodiment of the invention, ultra-high chip packing density is obtained without the need for solder or wire bonding each individual chip.

In accordance with the present invention, a method of making a photo-radiation source is provided. A first planar conductor is provided and a formation of light emitting chips formed on the first planar conductor. Each chip has a cathode and an anode. One of the cathode and anode of each chip is in contact with the first planar conductor. A second planar conductor is disposed on top of the formation of light emitting chips, so that the second planar conductor is in contact with the other of the cathode and anode of each chip. The first planar conductor is bound to the second planar conductor to permanently maintain the formation of light emitting chips. In accordance with the present invention, the formation is maintained, and the electrical contact with the conductors is obtained, without the use of solder or wire bonding for making an electrical and mechanical contact between the chips and either of the first planar conductor and the second planar conductor.

BRIEF DESCRIPTION OF THE DRAWINGS

FIG. 23 illustrates an inventive light active sheet thermo-formed into a three-dimensional article;

FIG. 24(a) illustrates an inventive light active sheet fabricated into a lampshade form-factor having a voltage conditioner for conditioning available electrical current;

FIG. 24(b) illustrates an inventive light active sheet fabricated into a light-bulb form-factor having a voltage conditioner for conditioning available electrical current;

FIG. 25 is a cross-sectional view of an inventive light sheet employed in the light bulb form factor show in FIG. 24;

FIG. 26(a) illustrates an inventive light sheet configured as a heads-up-display (HUD) installed as an element of a vehicle windshield;

FIG. 26(b) is a block diagram showing a driving circuit for an inventive HUD with a collision avoidance system;

FIG. 27 is an exploded view of an inventive light sheet utilized as a thin, bright, flexible, energy efficient backlight component for an LCD display system;

FIG. 40 illustrates an embodiment of the inventive light sheet being cut, stamped or otherwise shaped into a desired configuration;

FIG. 41 illustrates a cut configuration of the inventive light sheet mounted on a backing board;

FIG. 42 illustrates the cut configuration of the inventive light sheet lighting up when voltage is applied;

FIG. 43 illustrates the cut configuration of the inventive light sheet employed for light emissive signage;

FIG. 46 shows an example of a light-pipe photo-polymerization system having an embodiment of the inventive photo-radiation source;

FIG. 47 shows an example of a three-dimensional scanned curing system having an embodiment of the inventive photo-radiation source;

FIG. 53 shows an isolated view of a substrate with an optical surface for controlling the focus of light emitted from an embodiment of the inventive photo-radiation source;

FIG. 54 shows an embodiment of the inventive photo-radiation source having a flat light sheet construction with a top substrate with an optical surface;

FIG. 55 shows the inventive photo-radiation source having a curved light sheet construction shaped with a light emission enhancing curvature;

FIG. 56 is a schematic side view of the curved light sheet construction illustrating the focal point of light emission;

FIG. 62 is cross-sectional block diagram showing the constituent parts of the inventive light active sheet;

FIG. 63 is a cross-section block diagram of an embodiment of the inventive light active sheet having a cross-linked polymer (e.g., polysiloxane-g-oglio9ethylene oxide) matrix, UV semiconductor elements, and phosphor re-emitter;

FIG. 64 is a cross-sectional block diagram of an embodiment of the inventive light active sheet having a light diffusive and/or re-emitter coating on a transparent substrate;

FIG. 65 is a cross-sectional block diagram of an embodiment of the inventive light active sheet having blue and yellow semiconductor elements, and light diffusers (e.g., glass beads) within the matrix;

DETAILED DESCRIPTION OF THE DRAWINGS

Figure 1:
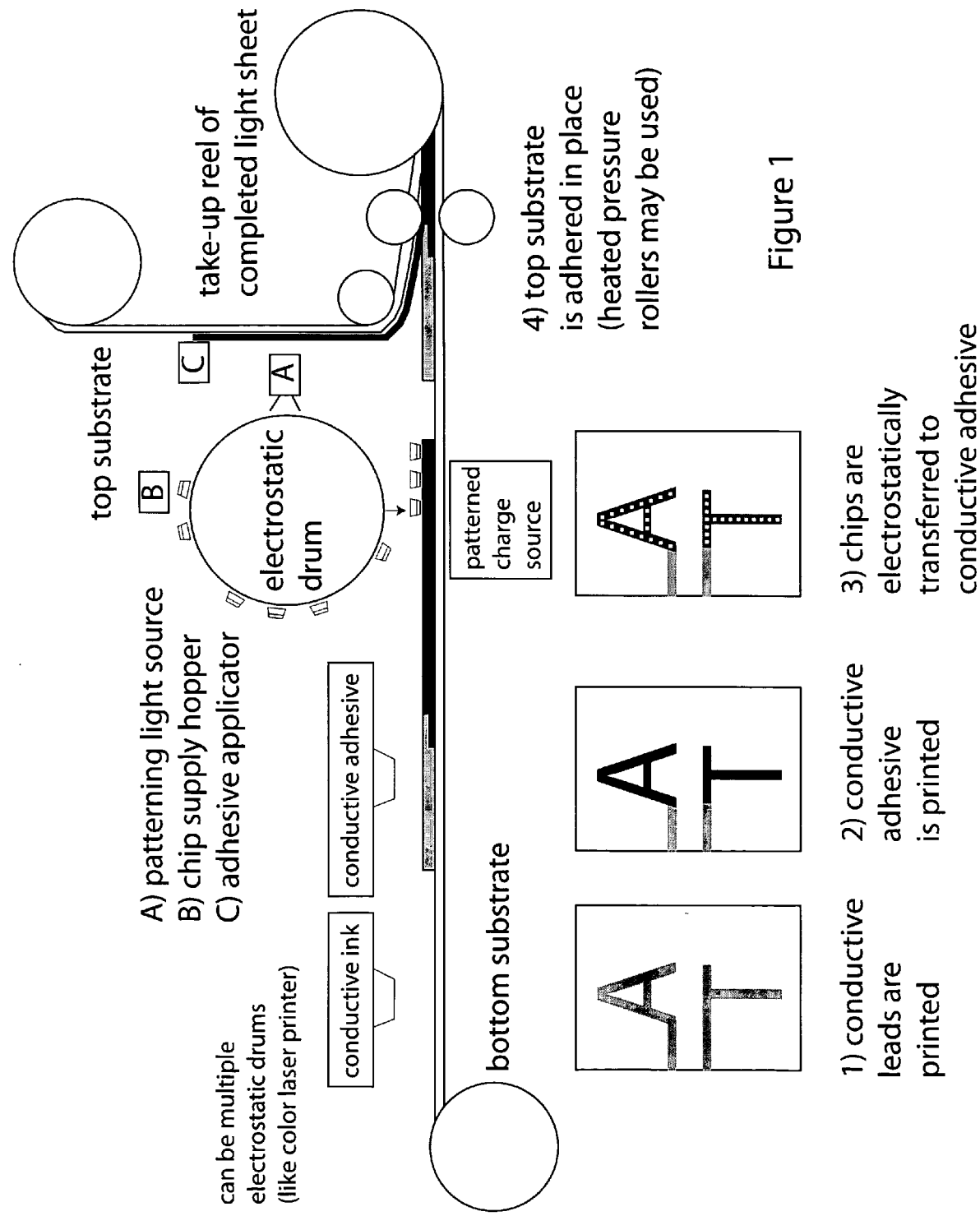
FIG. 1 illustrates the inventive method for manufacturing a patterned light active sheet.

For purposes of promoting an understanding of the principles of the invention, reference will now be made to the embodiments illustrated in the drawings and specific language will be used to describe the same. It will nevertheless be understood that no limitation of the scope of the invention is thereby intended, there being contemplated such alterations and modifications of the illustrated device, and such further applications of the principles of the invention as disclosed herein, as would normally occur to one skilled in the art to which the invention pertains.

FIG. 1 illustrates the inventive method for manufacturing a patterned light active sheet. In accordance with the present invention, a solid-state light active sheet is provided, and a method for manufacturing the same. The solid-state light active sheet is effective for applications such as flexible solar panels and light sensors, as well as high efficiency lighting and display products. The inventive light sheet utilizes semiconductor elements, such as commercially available LED chips, to create a totally new form of solar panel, lighting, signage and display devices. The light sheet can be constructed to provide an even, diffuse solid-state lighting device that is ultra-thin, flexible and highly robust. An embodiment of the inventive manufacturing method is based on the well-known physics and mechanical and electrical components found in a conventional desktop laser printer. In essence, in accordance with this inventive embodiment, LED chips replace the toner of a laser printer. The result is a unique light sheet form factor adaptable to an extraordinarily broad range of applications. These applications range from interior tent lighting, to display backlighting, to commercial and municipal signage and traffic control signals to replacements for incandescent and fluorescent source lighting.

The inventive manufacturing process starts with a roll of flexible, plastic substrate. (1) A conductive electrode pattern is formed on the substrate through a variety of well-known printing techniques, such as inkjet printing. This electrode pattern is used to bring power to the chips. (2) Next, a conductive adhesive is printed at locations where the LED chips will be patterned. (3) Then, using an electrostatic drum and charge patterning mechanism similar to a laser printer engine, LED chips are patterned onto the electrostatic drum. The chip pattern is then transferred to the adhesive areas that have been formed on the substrate. (4) A top substrate coated with a conductor is then brought in to complete the solid-state, ultra thin, flexible light sheet sandwich. (5) Finally, the completed light sheet is rolled up on a take-up reel. This light sheet material can then be cut, stamped, thermoformed, bent and packaged into a wide range of new and useful solid-state lighting products.

In accordance with the invention, a method is provided for forming a sheet of light active material. A first substrate (bottom substrate, shown in FIG. 1) is provided having a transparent first conductive layer. The first substrate may be, for example, glass, flexible glass (available from Corning), PET, PAN, or other suitable polymer, Barrix (available from Vitrex) or other transparent or semi-transparent substrate material. The transparent first conductive layer may be, for example, sputter coated indium-tin-oxide (ITO), a conductive polymer, a thin metal film, or the like.

A pattern of light active semiconductor elements are formed. The light active semiconductor elements may be, for example, LED chips having an n-side and a p-side and/or light-to-energy semiconductor layered particles wherein the n- and p-side correspond to charge donor and charge acceptor layers. Each light active semiconductor element has either of the n-side or the p-side in electrical communication with the transparent conductive layer. The electrical communication may be direct (i.e., surface to surface contact) or indirect (i.e., through a conductive or semi-conductive medium). A second substrate having a second conductive layer is provided. The second substrate may be, for example, a metal foil, a metal coated polymer sheet, a conductive polymer coated metal foil or polymer sheet, or the like. The second substrate is secured to the first substrate so that the other of said n-side or said p-side of each said light active semiconductor element in electrical communication with the second conductive layer. Again, the electrical communication can be direct or indirect. Thus, in accordance with the present invention, a solid-state sheet of light active material is formed.

The transparent first conductive layer may comprise a transparent coating preformed on the first substrate. For example, the substrate may be a sheet or roll of a polymer film, such as PET or PAN, with a sputter coated conductor comprised of ITO. Alternatively, as shown in FIG. 1, the transparent coating can be applied as a conductive ink or conductive adhesive.

The pattern of light active semiconductor elements can be formed by electrostatically attracting the light active semiconductor elements to a transfer member. Then, the attracted light active semiconductor elements are transferred from the transfer member to the first substrate. The transfer member may include an opto-electric coating effective for holding a patterned electrostatic charge. The patterned electrostatic charge is effective for electrostatically attracting the light active semiconductor elements and forming the pattern of light active semiconductor elements. The optical patterning of the opto-electric coating can be done, for example, using a scanned laser beam and an LED light source, similar to the process used by laser or LED printers. Thus, the transfer member may comprise an opto-electric coated drum, and the patterning mechanism may be similar to the well-know mechanism employed for patterning toner in a laser or LED printer.

An adhesive pattern can be formed on the first substrate for adhering the pattern of light active semiconductor elements to the first substrate. Alternatively, or additionally, an adhesive pattern can also be formed on the first substrate for adhering the second substrate to the first substrate.

A pattern of light active semiconductor elements can be formed by forming a first pattern of first light active semiconductor elements and forming a second pattern of second light active semiconductor elements. The first light active semiconductor elements emit light having a first color and the second light active semiconductor elements emit light having a second color. Alternatively, the first light active semiconductor elements emit light and the second light active semiconductor elements convert light to electrical energy.

The first conductive layer may be formed as a grid of x-electrodes, and the second conductive layer formed as a grid of y-electrodes, so that each respective light active semiconductor element is addressable for forming a sheet of light active material capable of functioning as a pixilated display component.

The pattern of light active semiconductor elements can be formed by forming a first pattern of first color light emitting semiconductor elements, forming a second pattern of second color light emitting semiconductor elements and forming a third pattern of third color light emitting semiconductor element. The first conductive layer may be formed as a grid of x-electrodes, and the second conductive layer formed as a grid of y-electrodes, so that each respective light active semiconductor is addressable for forming a sheet of light active material capable of functioning as a full-color pixilated display component.

Figure 2:
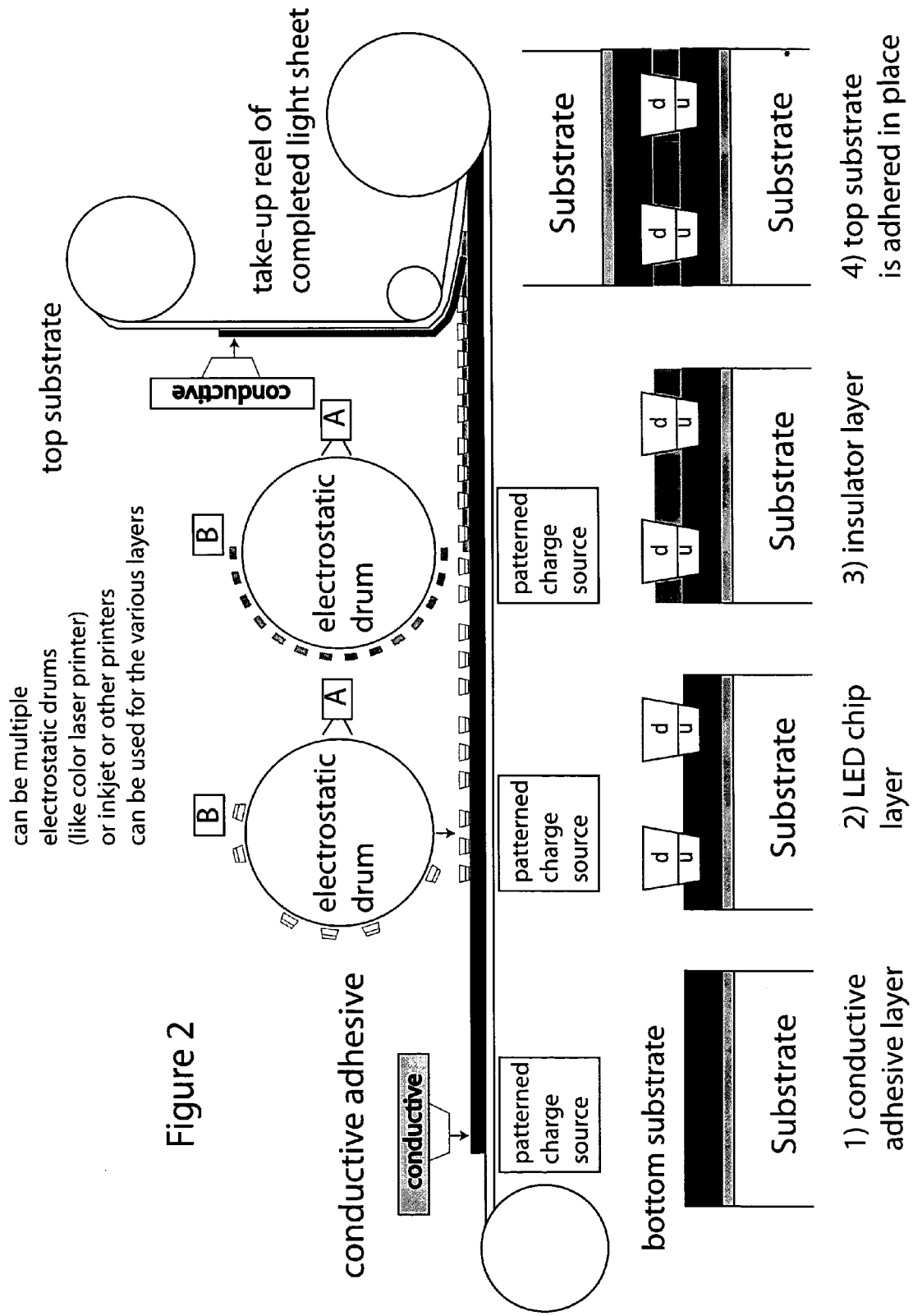
FIG. 2 illustrates another inventive method for manufacturing a light active sheet.

FIG. 2 illustrates another inventive method for manufacturing a light active sheet. In each example of the mechanism employed for forming the inventive light active sheet, the components and processes can be mixed in a number of iterations. The examples herein depict a selection of such iterations, but represent just a few of the possible process and material combinations contemplated by the inventive methods and device structures. As shown in FIG. 2, a first substrate is provided. A first conductive surface is formed on the first substrate. A pattern of LED chips is formed on the conductive surface. In the example shown, the conductive surface is provided as a conductive adhesive. However, the conductive surface may be, for example an ITO coating pre-formed on the bottom substrate. Each LED chip has an anode and a cathode side. A second substrate is provided. A second conductive surface is formed on the second substrate. The first substrate is fixed to the second substrate so that either of the anode and the cathode side of the LED chip is in electrical communication with the first conductive surface, and the other of the anode and the cathode side of the LED chips is in electrical communication with the second conductive surface. As shown, the LED chips may be encased within a conductive adhesive applied to the top and bottom substrate, with an insulator adhesive applied between the chips. Alternatively, only an insulator adhesive may be applied between the chips for fixing the top and bottom substrate together. The chips are then held in electrical contact with the top and bottom substrate conductive surfaces through the clamping force applied by the insulator adhesive. As other alternatives, only one or both of the substrates may have a conductive or non-conductive adhesive applied to it (through inkjet, silkscreen, doctor blade, slot-die coating, electrostatic coating, etc.), and the chips adhered directly or clamped between the substrates.

The first conductive surface may be formed as a conductive pattern comprised of at least one of a conductive coating, a conductive ink and a conductive adhesive. At least one of the first and the second conductive surface is a transparent conductor. At least one of the first and the second conductive surface is preformed on the respective first and second substrate. The first conductive surface can be formed using a printing method. The printing method may comprise at least one of an inkjet printing method, a laser printing method, a silk-screen printing method, a gravure printing method and a donor transfer sheet printing method.

An adhesive layer may be formed between the top substrate and the bottom substrate. The adhesive layer may comprise at least one of a conductive adhesive, a semi-conductive adhesive, an insulative adhesive, a conductive polymer, a semi-conductive polymer, and an insulative polymer. A function-enhancing layer can be formed between the top substrate layer and the bottom substrate layer. The function-enhancing layer includes at least one of a re-emitter, a light-scatterer, an adhesive, and a conductor.

The pattern of LED chips can be formed by electrostatically attracting the LED chips to a transfer member, and then transferring the attracted LED chips from the transfer member to the first conductive surface. The transfer member may include an opto-electric coating effective for holding a patterned electrostatic charge, the patterned electrostatic charge being effective for electrostatically attracting and forming the pattern of LED chips. The the opto-electric coating can be patterned using at least one of a scanned laser beam and an LED light source. The transfer member may be a drum, a flat planar member, or other shape. The method of transferring the chips may also include a pick-and-place robotic method, or simple sprinkling of the semiconductor elements (i.e., the chips) onto an adhesive surface applied to the substrate.

Figure 3:
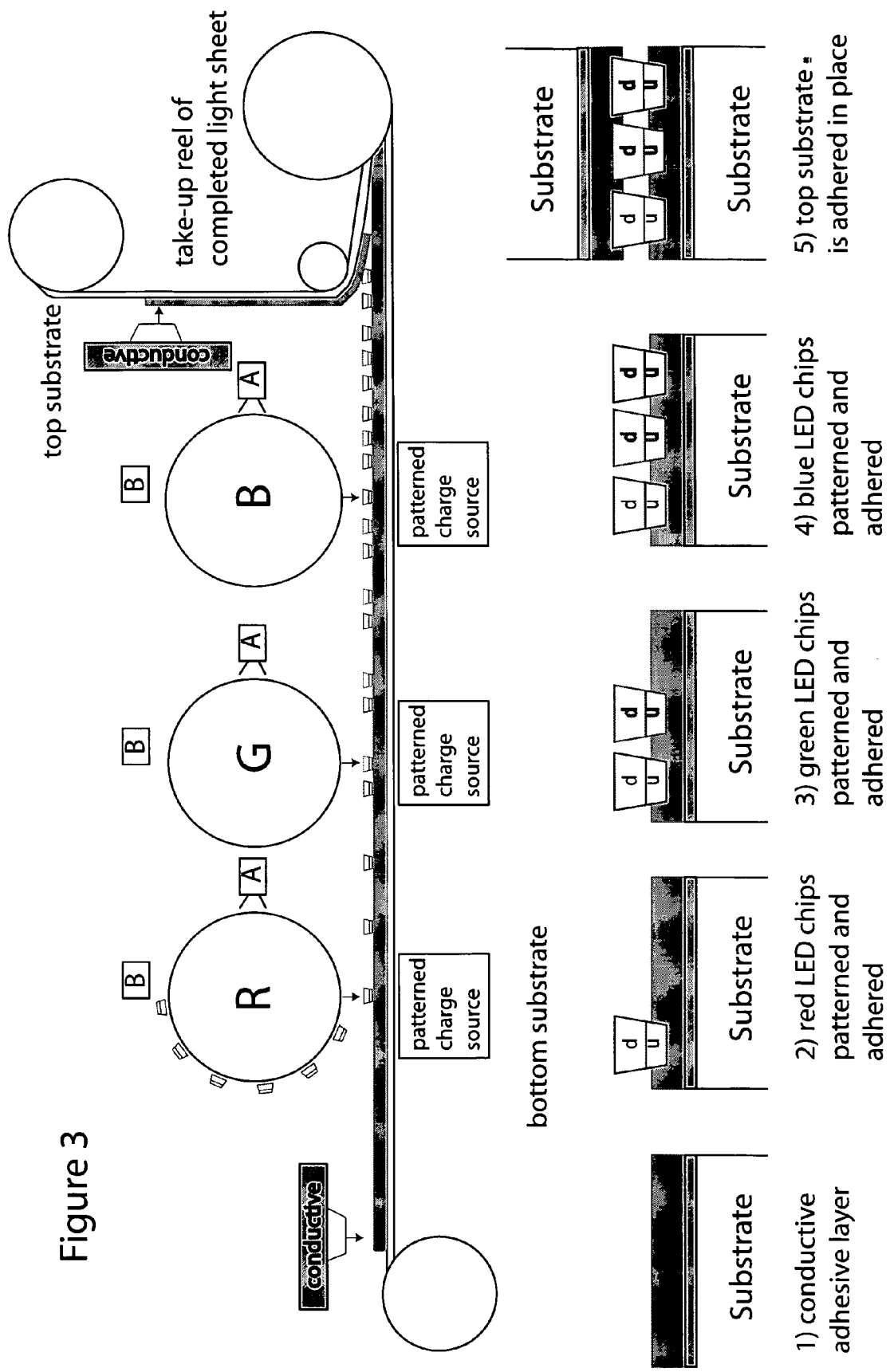
FIG. 3 illustrates another inventive method for manufacturing a light active sheet having two or more different types of light active semiconductor elements.

FIG. 3 illustrates another inventive method for manufacturing a light active sheet having two or more different types of light active semiconductor elements. A pattern of light active semiconductor elements can be formed by forming a first pattern of first light active semiconductor elements and forming a second pattern of second light active semiconductor elements. The first light active semiconductor elements emit light having a first color and the second light active semiconductor elements emit light having a second color. Alternatively, the first light active semiconductor elements emit light and the second light active semiconductor elements convert light to electrical energy.

The first conductive layer may be formed as a grid of x-electrodes, and the second conductive layer formed as a grid of y-electrodes, so that each respective light active semiconductor element is addressable for forming a sheet of light active material capable of functioning as a pixilated display component.

The pattern of light active semiconductor elements can be formed by forming a first pattern of first color light emitting semiconductor elements, forming a second pattern of second color light emitting semiconductor elements and forming a third pattern of third color light emitting semiconductor element. The first conductive layer may be formed as a grid of x-electrodes, and the second conductive layer formed as a grid of y-electrodes, so that each respective light active semiconductor is addressable for forming a sheet of light active material capable of functioning as a full-color pixilated display component.

The inventive methods shown by way of example in FIGS. 1-3 can be employed for creating a roll-to-roll or sheet manufacturing process for making light emitting sheet material or light-to-energy sheet material. In accordance with another aspect of the invention, a method is provided for forming a light-to-energy device. A first substrate is provided. A first conductive surface is formed on the first substrate. A pattern of semiconductor elements is formed on the conductive pattern. Each semiconductor element comprises a charge donor side and a charge acceptor side. For example, the semiconductor elements may comprise a crystalline silicone-based solar panel-type semiconductor layered structure. Alternatively, other semiconductor layered structures can be used for the semiconductor elements, including but not limited to, various thin film amorphous silicon semiconductor systems know in the art that have been particle-ized.

In accordance with the inventive method, a second conductive surface is formed on a second substrate. The first substrate is fixed to the second substrate so that either of the charge donor and the charge acceptor side of the semiconductor elements is in electrical communication with the first conductive surface and the other of the charge donor and the charge acceptor side of the semiconductor elements is in electrical communication with the second conductive surface.

The first conductive surface is formed as a conductive pattern comprised of at least one of a conductive coating, a conductive ink and a conductive adhesive. At least one of the first and the second conductive surface is a transparent conductor. At least one of the first and the second conductive surface is preformed on the respective first and second substrate. The first conductive surface may be formed using a printing method. The printing method may comprise at least one of an inkjet printing method, a laser printing method, a silk-screen printing method, a gravure printing method and a donor transfer sheet printing method.

An adhesive layer can be formed between the top substrate and the bottom substrate. The adhesive layer may comprise at least one of a conductive adhesive, a semi-conductive adhesive, an insulative adhesive, a conductive polymer, a semi-conductive polymer, and an insulative polymer. A function-enhancing layer can be formed between the top substrate layer and the bottom substrate layer, wherein the function-enhancing layer includes at least one of a re-emitter, a light-scatterer, an adhesive, and a conductor.

The pattern of LED chips can be formed by electrostatically attracting the LED chips to a transfer member, and then transferring the attracted LED chips from the transfer member to the first conductive surface. The transfer member may include an opto-electric coating effective for holding a patterned electrostatic charge, the patterned electrostatic charge being effective for electrostatically attracting and forming the pattern of LED chips. The opto-electric coating can be patterned using at least one of a scanned laser beam and an LED light source. The transfer member may be shaped as a drum, a flat planar member, or other shape.

Figure 4:
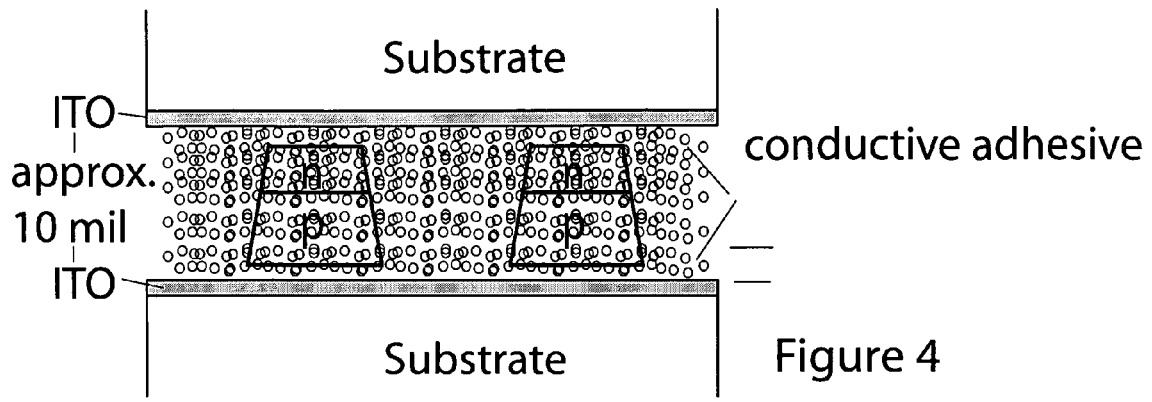
FIG. 4 is a cross-sectional view of an inventive light active sheet having a conductive adhesive for fixing the substrates and/or the light active semiconductor elements in place.

FIG. 4 is a cross-sectional view of an inventive light active sheet having a conductive adhesive for fixing the substrates and/or the light active semiconductor elements in place. In accordance with this aspect of the invention, device structures are provide for sheets of light active material. The examples shown herein are illustrative of various iterations of the device structure, and constituent parts in each example can be mixed in additional iterations not specifically described herein.

A first substrate has a transparent first conductive layer. A pattern of light active semiconductor elements fixed to the first substrate. The light active semiconductor elements have an n-side and a p-side. Each light active semiconductor element has either of the n-side or the p-side in electrical communication with the transparent conductive layer. A second substrate has a second conductive layer. An adhesive secures the second substrate to the first substrate so that the other of said n-side or said p-side of each said light active semiconductor element is in electrical communication with the second conductive layer. Thus, a solid-state light active device is formed.

The transparent first conductive layer may comprise a transparent coating preformed on the first substrate. The transparent coating can be a conductive ink or conductive adhesive. An adhesive pattern may be formed on the first substrate for adhering the pattern of light active semiconductor elements to the first substrate. Alternatively, or additionally, an adhesive pattern may be formed on the first substrate for adhering the second substrate to the first substrate.

Figure 5:
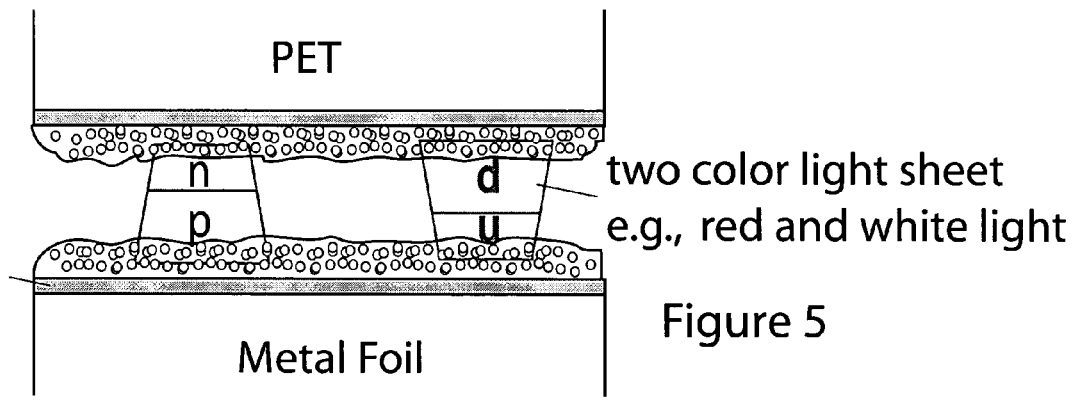
FIG. 5 is a cross-sectional view of an inventive light active sheet having two different types of light active semiconductor elements oriented to be driven with opposite polarity electrical energy.

FIG. 5 is a cross-sectional view of an inventive light active sheet having two different types of light active semiconductor elements oriented to be driven with opposite polarity electrical energy. The pattern of light active semiconductor elements may comprise a first pattern of first light active semiconductor elements and a second pattern of second light active semiconductor elements. The first light active semiconductor elements may emit light having a first color and the second light active semiconductor elements emit light having a second color. Alternatively, the first light active semiconductor elements may emit light and the second light active semiconductor elements convert light to electrical energy.

Figure 6:
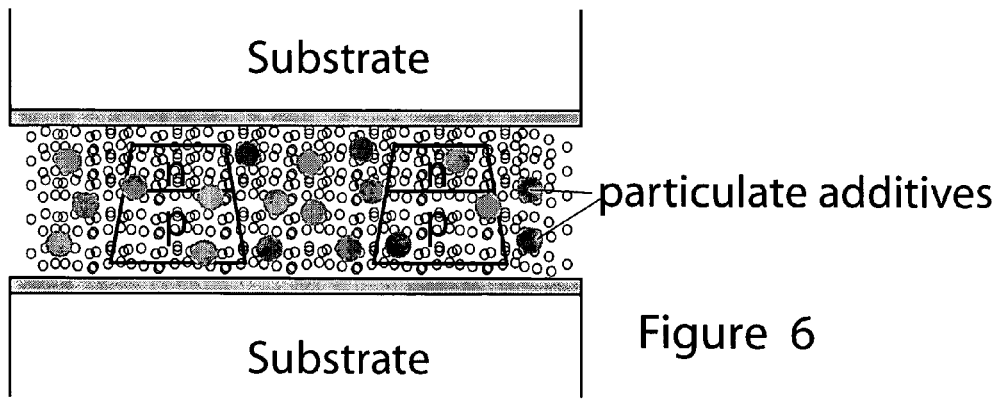
FIG. 6 is a cross-sectional view of an inventive light active sheet having additives included between the substrates to improve the desired light active sheet properties.

FIG. 6 is a cross-sectional view of an inventive light active sheet having additives included between the substrates to improve the desired light active sheet properties. The inventive light-emitting device comprises a first substrate. A first conductive surface is formed on the first substrate. A pattern of LED chips is formed on the conductive pattern. Each LED chip has an anode and a cathode side. A second substrate has a second conductive surface formed on it. An adhesive fixes the first substrate to the second substrate so that either of the anode and the cathode side of the LED chip is in electrical communication with the first conductive surface, and the other of the anode and the cathode side of the LED chips is in electrical communication with the second conductive surface.

The first conductive surface can be formed as a conductive pattern comprised of at least one of a conductive coating, a conductive ink and a conductive adhesive. At least one of the first and the second conductive surface is a transparent conductor. At least one of the first and the second conductive surface can be preformed on the respective first and second substrate. The first conductive surface can be formed using a printing method. The printing method may comprise at least one of an inkjet printing method, a laser printing method, a silk-screen printing method, a gravure printing method and a donor transfer sheet printing method.

The adhesive layer can comprise at least one of the top substrate and the bottom substrate. The adhesive layer can comprise at least one of a conductive adhesive, a semiconductive adhesive, an insulative adhesive, a conductive polymer, a semi-conductive polymer, and an insulative polymer. A function-enhancing layer can be formed between the top substrate layer and the bottom substrate layer. The function-enhancing layer may include at least one of a re-emitter, a light-scatterer, an adhesive, and a conductor.

Figure 7:
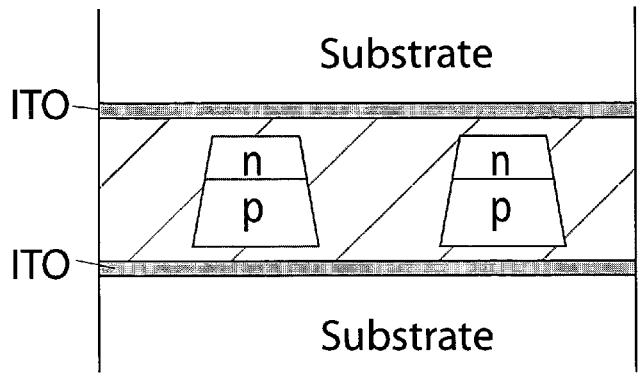
FIG. 7 is a cross-sectional view of an inventive light active sheet having the light active semiconductor elements disposed within a solid-state electrolyte.

FIG. 7 is a cross-sectional view of an inventive light active sheet having the light active semiconductor elements disposed within a solid-state electrolyte. In accordance with an embodiment of the inventive light active sheet, a top PET substrate has a coating of ITO, acting as the top electrode. A bottom PET substrate can be ITO PET, metal foil, metalized mylar, etc., depending on the intended application of the light sheet (e.g., transparent HUD element, light source, solar panel, etc.). The matrix (carrier) material may be a transparent photopolymerizable solid polymer electrolyte (SPE) based on cross-linked polysiloxane-g-oglio9ethylene oxide (see, for example, Solid polymer electrolytes based on cross-linked polysiloxane-g-oligo(ethylene oxide): ionic conductivityand electrochemical properties, Journal of Power Sources 119-121 (2003) 448-453, which is incorporated by reference herein). The emissive particulate may be commercially available LED chips, such as an AlGaAs/AlGaAs Red LED Chip—TK 112UR, available from Tyntek, Taiwan). Alternatively the particulate may be comprised of light-to-energy particles, having charge donor and charge acceptor semiconductor layers, such as found in typical silicon-based solar panels. In the case of an energy-to-light device (i.e., a light sheet), it may be preferable for the matrix material to be less electrically conductive than the semiconductor elements so that the preferred path of electrical conductivity is through the light emitting elements. In the case of a light-to-energy device (i.e., a solar panel), it may be preferable for the matrix material to be more electrically conductive than the semiconductor element so that charges separated at the donor/acceptor interface effectively migrate to the top and bottom substrate electrodes.

Figure 8:
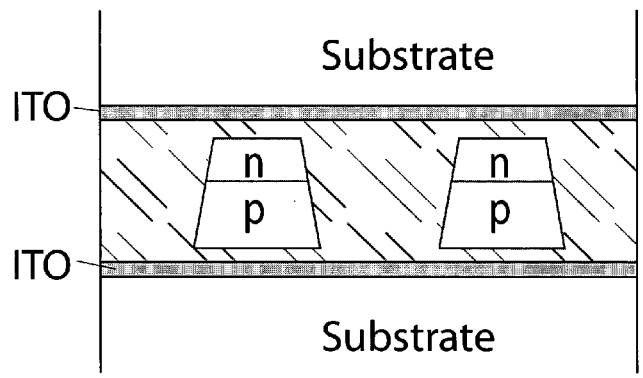
FIG. 8 is a cross-section view of an inventive light active sheet having the light active semiconductor elements disposed within a solid-state charge transport carrier.

FIG. 8 is a cross-section view of an inventive light active sheet having the light active semiconductor elements disposed within a solid-state charge transport carrier. As an example of a candidate solid-state charge transport carrier, an intrinsically conductive polymer, Poly(thieno[3,4-b]thiophene), has been shown to exhibit the necessary electronic, optical and mechanical properties. (see, for example, Poly(thieno[3,4-b]thiophene): A p- and n-Dopable Polythiophene Exhibiting High Optical Transparency in the Semiconducting State, Gregory A. Sotzing and Kyunghoon Lee, 7281 Macromolecules 2002, 35, 7281-7286, which is incorporated by reference herein)

Figure 9:
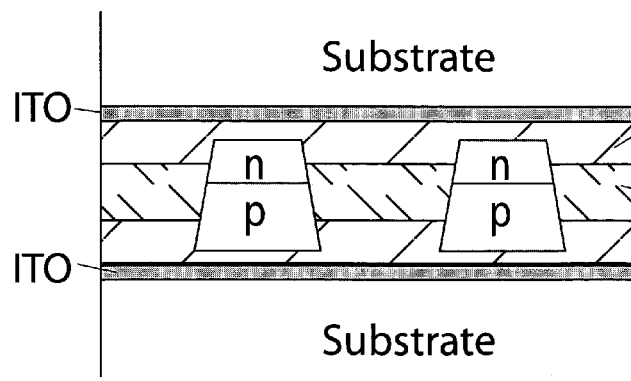
FIG. 9 is a cross-section view of an inventive light active sheet having an insulator material disposed between the top and bottom substrates.

FIG. 9 is a cross-section view of an inventive light active sheet having an insulator material disposed between the top and bottom substrates. The insulator may be an adhesive, such as an epoxy, heat-meltable polymer, etc. As shown, the semiconductor elements (e.g., LED chips) are fixed to the top and bottom substrates through a solid-state conductive adhesive, charge transport carrier or solid-state electrolyte. Alternatively, the semiconductor elements may be in direct contact with the top and bottom conductors disposed on the top and bottom substrates, and the adhesive provided between the LED chips to secure the top and substrates together and clamp the chips in electrical contact with the top and bottom conductors.

Figure 10:
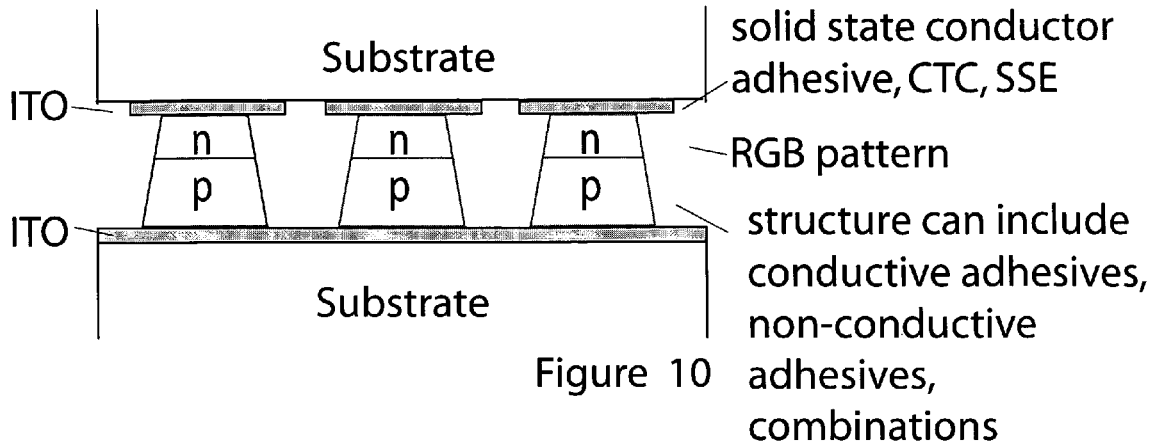
FIG. 10 is a cross-sectional view of the inventive light active sheet having an RGB semiconductor element pattern for forming a full-color light emissive display.

FIG. 10 is a cross-sectional view of the inventive light active sheet having an RGB semiconductor element pattern for forming a full-color light emissive display. The first conductive layer may be formed as a grid of x-electrodes, and the second conductive layer formed as a grid of y-electrodes. Each respective light active semiconductor element is disposed at the respective intersections of the x and y grid and are thus addressable for forming a sheet of light active material capable of functioning as a pixilated display component.

The pattern of light active semiconductor elements may comprise a first pattern of first color light emitting semiconductor elements, a second pattern of second color light emitting semiconductor elements and a third pattern of third color light emitting semiconductor element. The first conductive layer may be formed as a grid of x-electrodes, and the second conductive layer being formed as a grid of y-electrodes. The respective first, second and third color light emitting elements may be disposed at the intersections of the x and y grid so that each respective light active semiconductor is addressable. Thus, a sheet of light active material is formed capable of functioning as a full-color pixilated display component.

Figure 11:
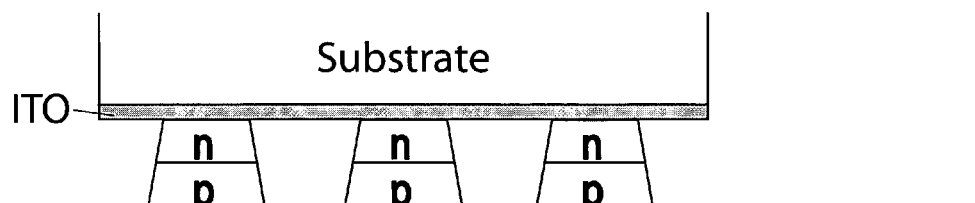
FIG. 11 is a cross-sectional view of the inventive light active sheet having a transparent substrate with a convex lens system.
Figure 12:
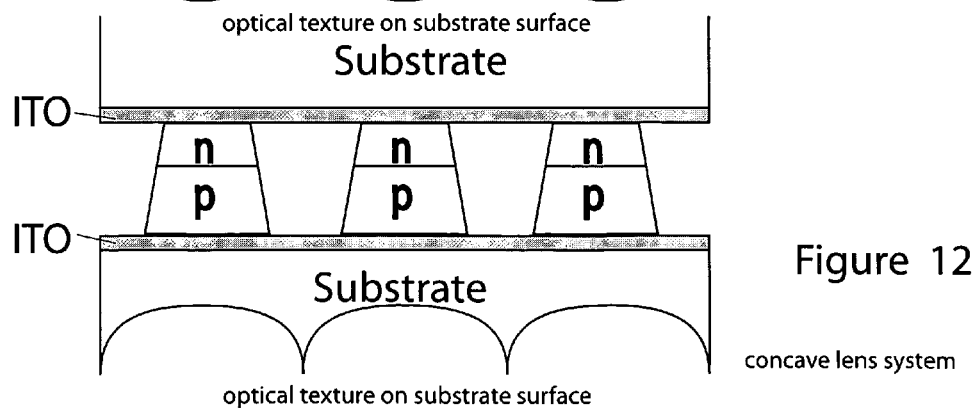
FIG. 12 is a cross-sectional view of the inventive light active sheet having a transparent substrate with a concave lens system.

FIG. 11 is a cross-sectional view of the inventive light active sheet having a transparent substrate with a convex lens system. The substrate may be formed having a lens element disposed adjacent to each point-source light emitter (LED chip), or an additional lens layer be fixed to the substrate. The lens system may be concave for concentrating the light output from each emitter (as shown in FIG. 11) or convex for creating a more diffuse emission from the inventive light sheet (as shown in FIG. 12).

The devices shown, for example, in FIGS. 4-12, illustrate various configurations of a light emitting sheet material. The LED chips shown are typical chips having top and bottom metal electrodes. However, in accordance with the present invention, the proper selection of materials (conductive adhesives, charge transport materials, electrolytes, conductors, etc.) may enable LED chips to be employed that do not require either or both the top and bottom metal electrodes. In this case, since the metal electrode in a typical device blocks the light output, the avoidance of the metal electrodes will effective increase the device efficiency.

These devices may also be configured as a light to energy device. In this case, a first conductive surface is formed on the first substrate. A pattern of semiconductor elements is formed on the conductive pattern. Each semiconductor element includes a charge donor layer side and a charge acceptor side. A second substrate is provided having a second conductive surface formed on it. An adhesive fixes the first substrate to the second substrate so that either of the charge donor and the charge acceptor side of the semiconductor elements is in electrical communication with the first conductive surface, and the other of the charge donor and the charge acceptor side of the semiconductor elements is in electrical communication with the second conductive surface.

The first conductive surface may be formed as a conductive pattern comprised of at least one of a conductive coating, a conductive ink and a conductive adhesive. At least one of the first and the second conductive surface is a transparent conductor. At least one of the first and the second conductive surface may be preformed on the respective first and second substrate. The adhesive may comprise at least one of the top substrate and the bottom substrate. The adhesive layer may comprise at least one of a conductive adhesive, a semi-conductive adhesive, an insulative adhesive, a conductive polymer, a semi-conductive polymer, and an insulative polymer.

Figure 13:
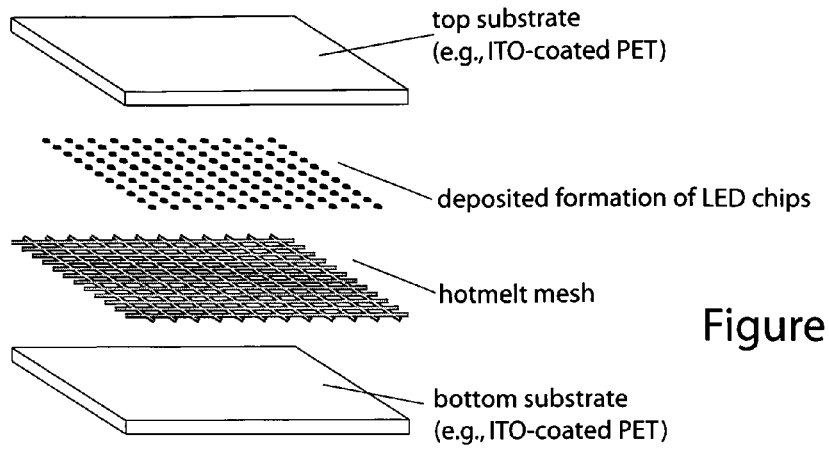
FIG. 13 is an exploded view of the inventive light active sheet having a melt adhesive mesh.
Figure 14:
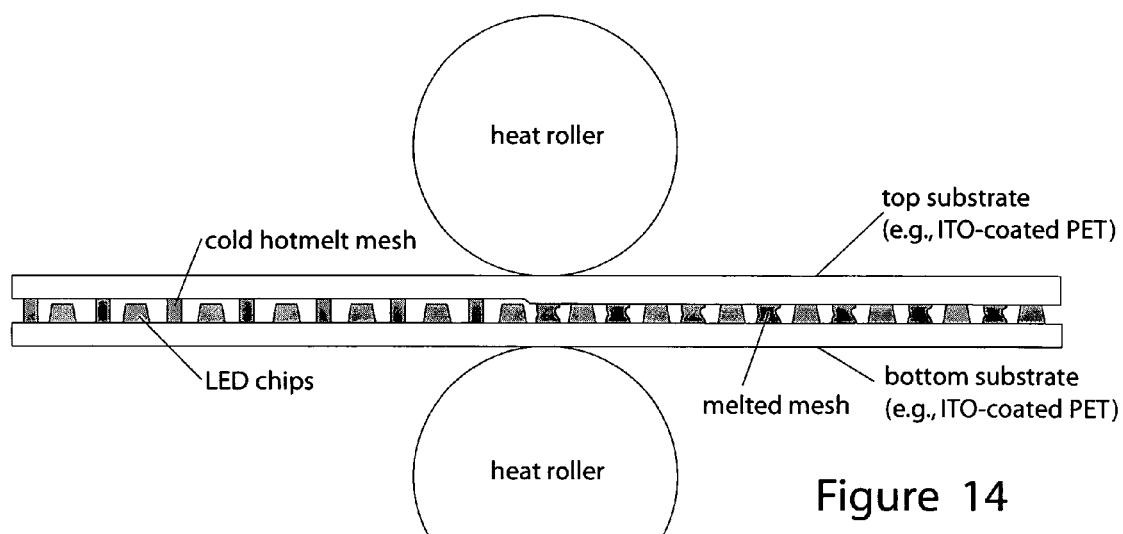
FIG. 14 is a schematic view of a method of manufacturing a light active sheet utilizing the melt adhesive mesh.

FIG. 13 is an exploded view of the inventive light active sheet having a melt adhesive mesh. The melt adhesive sheet may be incorporated during the manufacture of the light active sheet at any suitable point. For example, it may be preformed on the bottom substrate before the LED chips are transferred, and then after the chips are transferred to the spaces between the mesh, the top substrate applied. FIG. 14 is a schematic view of a method of manufacturing a light active sheet utilizing the melt adhesive mesh. In this case, heated pressure rollers melt the melt adhesive mesh and compress the top and bottom substrates together to effectively claim the LED chips into electrical contact with the substrate conductors. Conductive adhesives, electrolytes, charge transport materials, etc., as described herein may or may not be necessary, depending on the desire functional properties of the fabricated light active sheet.

Figure 15:
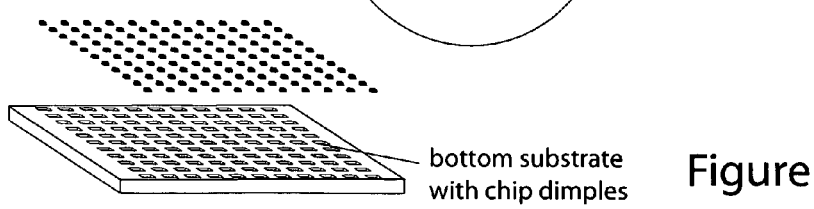
FIG. 15 is an exploded view of the inventive light active sheet comprising a substrate having position-facilitating chip dimples.
Figure 16:
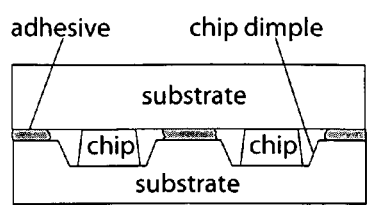
FIG. 16 is a cross-sectional view of the inventive light active sheet showing the position-facilitating chip dimples.

FIG. 15 is an exploded view of the inventive light active sheet comprising a substrate having position-facilitating chip dimples. FIG. 16 is a cross-sectional view of the inventive light active sheet showing the position-facilitating chip dimples. In this case, the position-facilitating chip dimples may be provided to help locate and maintain the positioning of the semiconductor elements.

Figure 17:
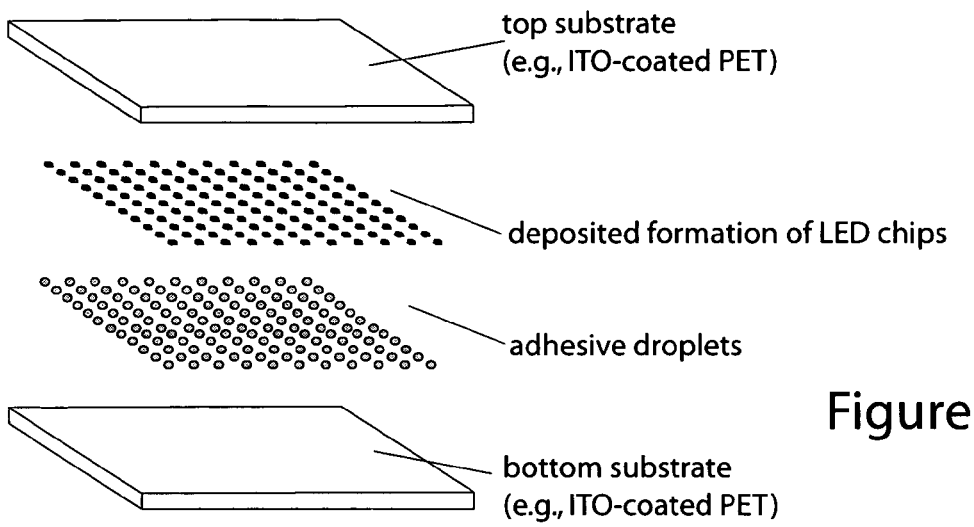
FIG. 17 is an exploded view of the light active sheet having adhesive droplets for fixing the semiconductor elements (chips) to the substrate and/or for adhering the top substrate to the bottom substrate.

FIG. 17 is an exploded view of the light active sheet having adhesive droplets for fixing the semiconductor elements (chips) to the substrate and/or for adhering the top substrate to the bottom substrate. The adhesive droplets can be preformed on the substrate(s) and may be heat melt adhesive, epoxy, pressure sensitive adhesive, or the like. Alternatively, the adhesive droplets may be formed during the roll-to-roll or sheet fabrication process using, for example, inkjet print heads, silkscreen printing, or the like. The adhesive droplets are provided to hold the chips in place, and/or to secure the top substrate and the bottom substrate together.

Figure 18:
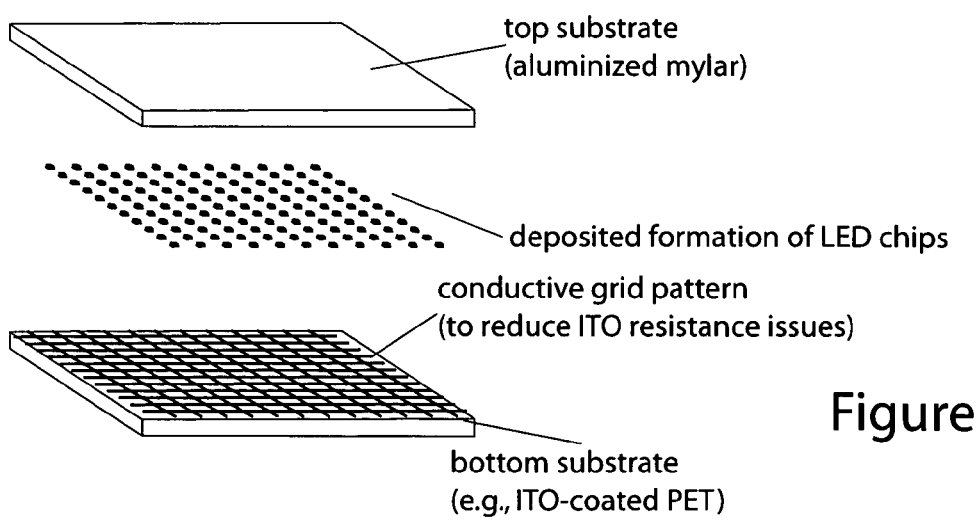
FIG. 18 is an exploded view of the light active sheet having an electrical resistance-reducing conductive grid pattern.

FIG. 18 is an exploded view of the light active sheet having an electrical resistance-reducing conductive grid pattern. The conductive grid pattern can be provided to reduce sheet resistance and improve the electrical characteristics of the fabricated light active sheet material.

Figure 19:
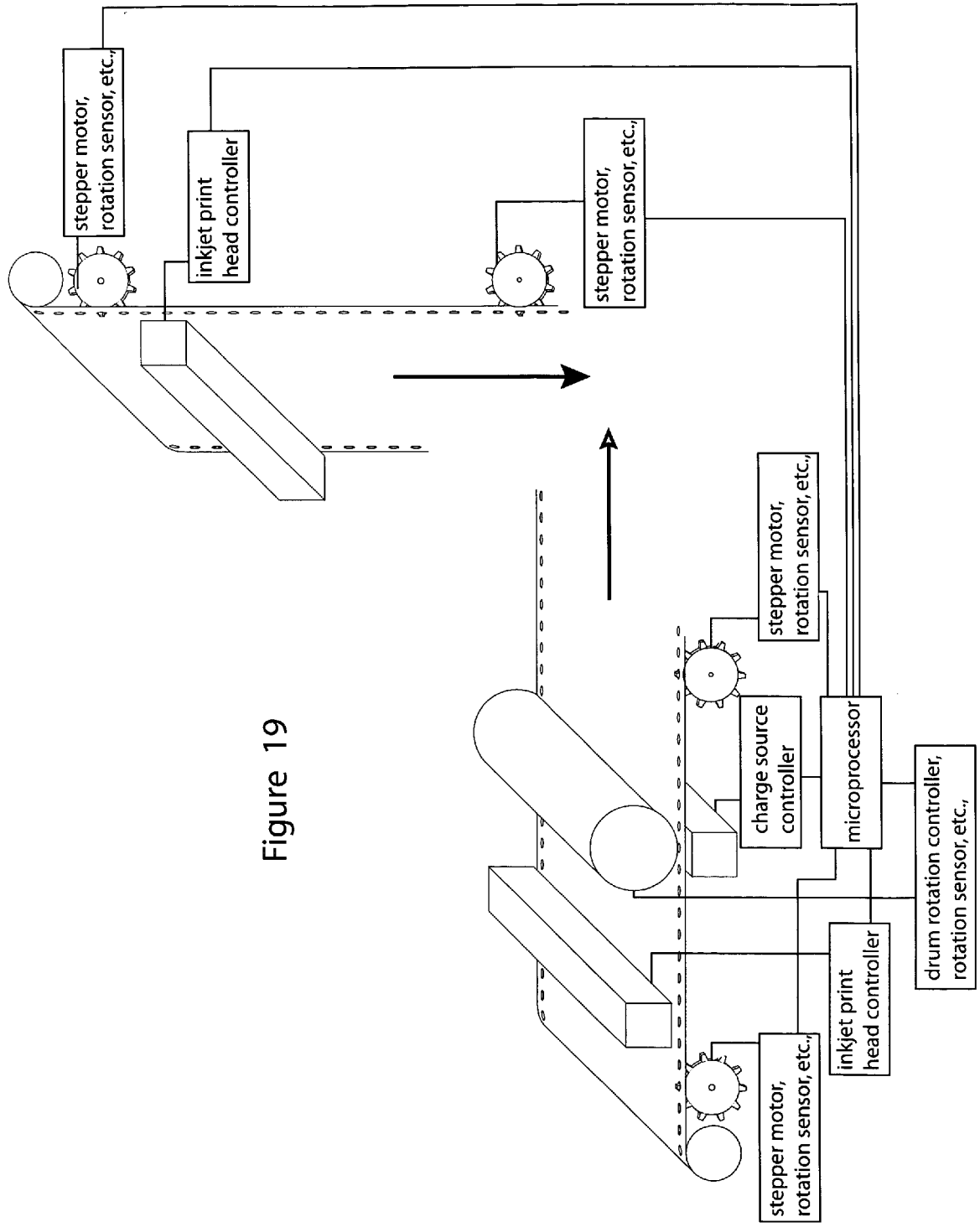
FIG. 19 is a schematic view of an inventive method of manufacturing a light active sheet wherein a hole-and-sprocket system is employed to ensure registration of the constituent parts of the inventive light sheet during the manufacturing process.

FIG. 19 is a schematic view of an inventive method of manufacturing a light active sheet wherein a hole-and-sprocket system is employed to ensure registration of the constituent parts of the inventive light sheet during the manufacturing process. The holes in the substrates (or a transfer sheet carrying the substrates) line up with the sprockets that may either be driven to move the substrates, and/or that may be driven by the movement of the substrates. In either case, rotational position detection of the sprockets is used to control the various active elements of the manufacturing system to ensure accurate registration between the constituent parts of the inventive light active sheet material.

Figure 20:
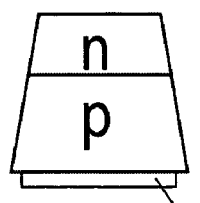
FIG. 20 is an isolated view of an inventive semiconductor element (e.g., LED chip) having a magnetically-attractive element to facilitate chip orientation and transfer.
Figure 21:
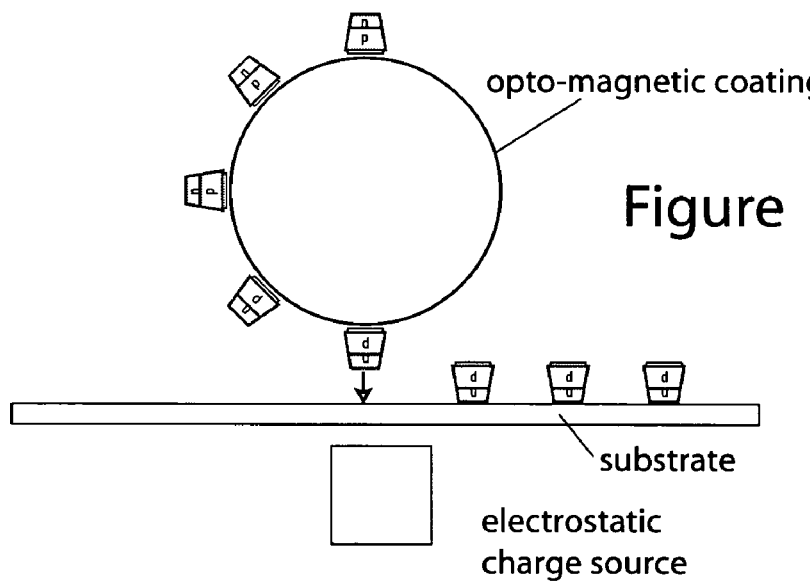
FIG. 21 illustrates the use of a magnetic drum and electrostatic charge source for orienting and transferring a pattern of semiconductor elements onto a substrate.
Figure 22:
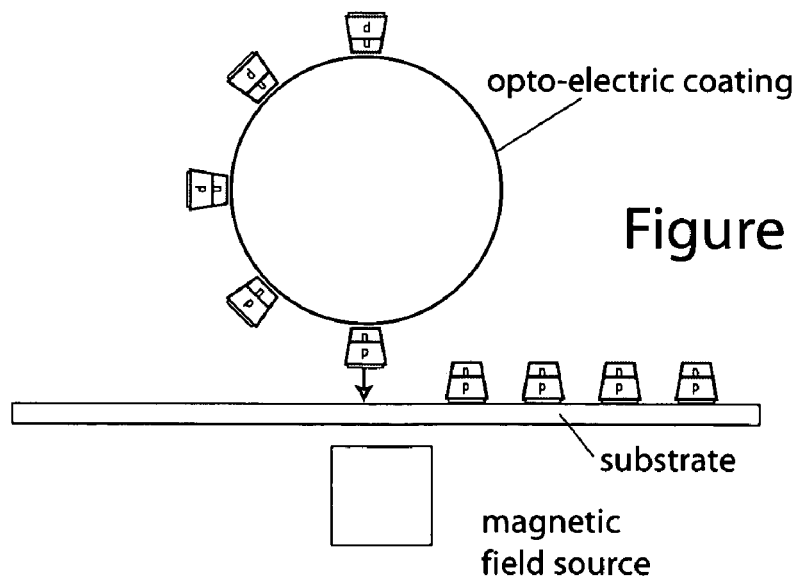
FIG. 22 illustrates the use of an electrostatic drum and magnetic attraction source for orienting and transferring a pattern of semiconductor elements onto a substrate.

FIG. 20 is an isolated view of an inventive semiconductor element (e.g., LED chip) having a magnetically-attractive element to facilitate chip orientation and transfer. The chips may include a magnetically active electrode component, or an additional magnetically active component. The magnetically active component enables the chips to be positioned and orient in response to an applied magnetic field. FIG. 21 illustrates the use of a magnetic drum and electrostatic charge source for orienting and transferring a pattern of semiconductor elements onto a substrate. FIG. 22 illustrates the use of an electrostatic drum and magnetic attraction source for orienting and transferring a pattern of semiconductor elements onto a substrate.

The inventive light sheet can be configured into a wide range of applications. FIG. 23 illustrates an inventive light active sheet thermoformed into a three-dimensional article. FIG. 24(a) illustrates an inventive light active sheet fabricated into a lampshade form-factor having a voltage conditioner for conditioning available electrical current. FIG. 24(b) illustrates an inventive light active sheet fabricated into a light-bulb form-factor having a voltage conditioner for conditioning available electrical current. FIG. 25 is a cross-sectional view of an inventive light sheet employed in the light bulb and lampshade form factor show in FIGS. 24(a) and (b). FIG. 26(a) illustrates an inventive light sheet configured as a heads-up-display (HUD) installed as an element of a vehicle windshield. FIG. 26(b) is a block diagram showing a driving circuit for an inventive HUD with a collision avoidance system. FIG. 27 is an exploded view of an inventive light sheet utilized as a thin, bright, flexible, energy efficient backlight component for an LCD display system.

Figure 28:
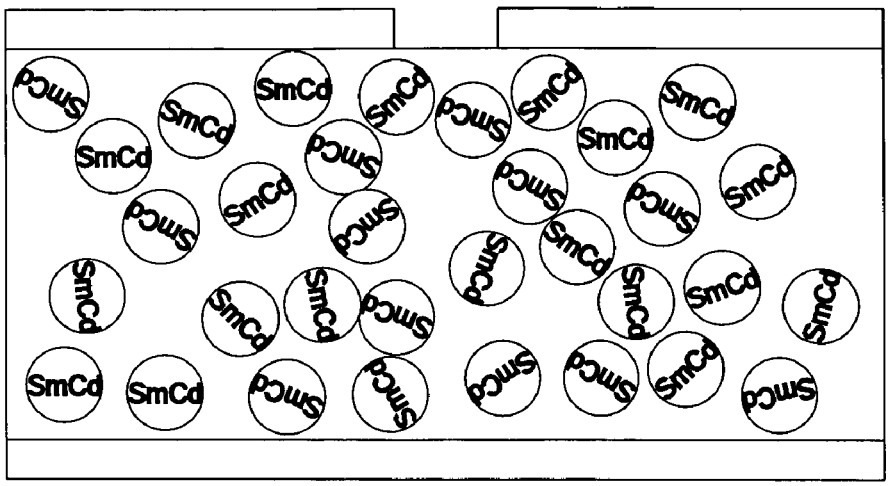
FIG. 28 schematically illustrates an embodiment of the inventive photo-radiation source showing a semiconductor particulate randomly dispersed within a conductive carrier matrix.

FIG. 28 illustrates an embodiment of the inventive photo-radiation source showing a semiconductor particulate randomly dispersed within a conductive carrier matrix. A light active device includes a semiconductor particulate dispersed within a carrier matrix material.

The carrier matrix material may be conductive, insulative or semiconductor and allows charges to move through it to the semiconductor particulate. The charges of opposite polarity moving into the semiconductor material combine to form charge carrier matrix pairs. The charge carrier matrix pairs decay with the emission of photons, so that light radiation is emitted from the semiconductor material. Alternatively, the semiconductor material and other components of the inventive photo-radiation source may be selected so that light received in the semiconductor particulate generates a flow of electrons. In this case, the photo-radiation source acts as a light sensor.

A first contact layer or first electrode is provided so that on application of an electric field charge carrier matrix having a polarity are injected into the semiconductor particulate through the conductive carrier matrix material. A second contact layer or second electrode is provided so that on application of the electric field to the second contact layer charge carrier matrix having an opposite polarity are injected into the semiconductor particulate through the conductive carrier matrix material. To form a display device, the first contact layer and the second contact layer can be arranged to form an array of pixel electrodes. Each pixel includes a portion of the semiconductor particulate dispersed within the conductive carrier matrix material. Each pixel is selectively addressable by applying a driving voltage to the appropriate first contact electrode and the second contact electrode.

Figure 28A:
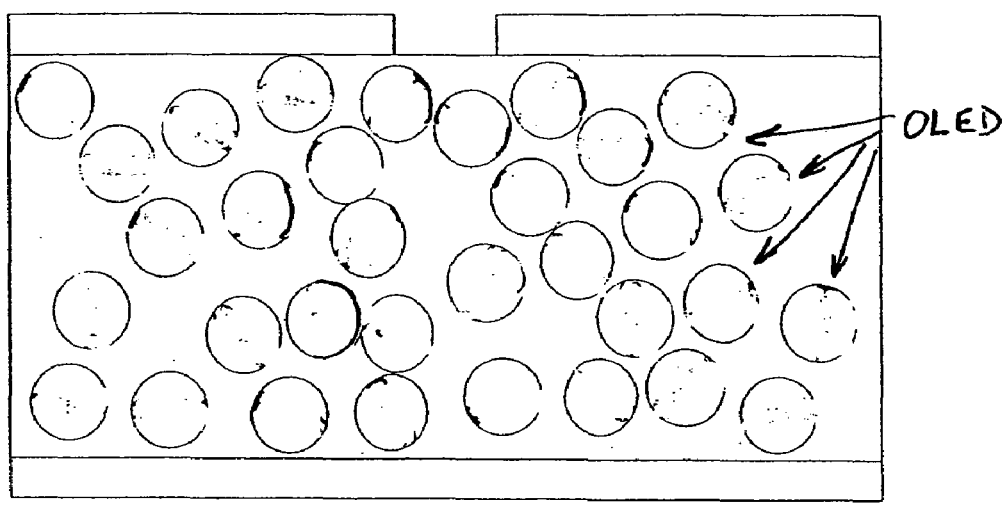
FIG. 28A schematically illustrates an embodiment of the inventive photo-radiation source showing an OLED semiconductor particulate randomly dispersed within a conductive carrier matrix.

The semiconductor particulate comprises at least one of an organic and an inorganic semiconductor. The semiconductor particulate can be, for example, a doped inorganic particle, such as the emissive component of a conventional LED. The semiconductor particulate can be, for another example, an organic light emitting diode particle (OLED), as seen in FIG. 28A. The semiconductor particulate may also comprise a combination of organic and inorganic materials to impart characteristics such as voltage control emission, aligning field attractiveness, emission color, emission efficiency, and the like.

The electrodes can be made from any suitable conductive material including electrode materials that may be metals, degenerate semiconductors, and conducting polymers. Examples of such materials include a wide variety of conducting materials including, but not limited to, indium-tin-oxide ("ITO"), metals such as gold, aluminum, calcium, silver, copper, indium and magnesium, alloys such as magnesium-silver, conducting fibers such as carbon fibers, and highly-conducting organic polymers such as highly-conducting doped polyaniline, highly-conducting doped polypyrole, or polyaniline salt (such as PAN-CSA) or other pyridyl nitrogen-containing polymer, such as polypyridylvinylene. Other examples may include materials that would allow the devices to be constructed as hybrid devices through the use of semiconductor materials, such as n-doped silicon, n-doped polyacetylene or n-doped polyparaphenylene.

Figure 29:
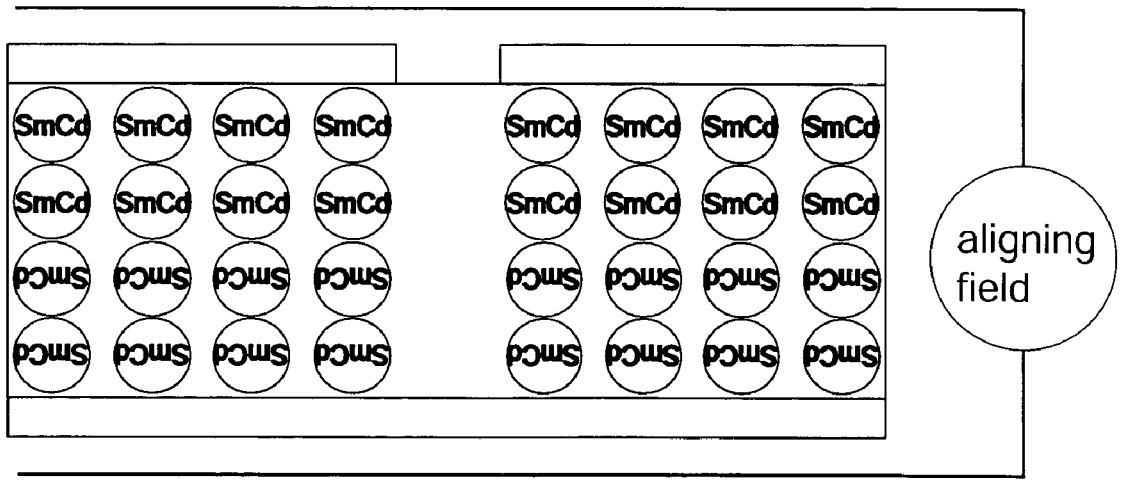
FIG. 29 illustrates an embodiment of the inventive photo-radiation source showing the semiconductor particulate aligned between electrodes.

As shown in FIG. 29, an embodiment of the inventive photo-radiation source may have the semiconductor particulate aligned between electrodes. The emissive particulate acts as point light sources within the carrier matrix material when holes and electrons are injected and recombine forming excitons. The excitons decay with the emission of radiation, such as light energy. In accordance with the present invention, the emissive particulate can be automatically aligned so that a significant majority of the point light sources are properly oriented and disposed between the electrodes (or array of electrodes in a display). This maximizes the light output from the device, greatly reduces cross-talk between pixels, and creates a protected emissive structure within the water, oxygen and contamination boundary provided by the hardened carrier matrix material.

In this case, the mixture disposed within the gap between the top and bottom electrodes includes a field reactive OLED particulate that is randomly dispersed within a fluid carrier matrix. An aligning field is applied between the top electrode and the bottom electrode. The field reactive OLED particulate moves within the carrier matrix material under the influence of the aligning field. Depending on the particulate composition, carrier matrix material and aligning field, the OLED particulates form chains between the electrodes (similar to the particulate in an electrical or magnetic Theological fluid in an electric or magnetic field), or otherwise becomes oriented in the aligning field. The aligning field is applied to form a desired orientation of the field reactive OLED particulate within the fluid carrier matrix. The fluid carrier matrix comprises a hardenable material. It can be organic or inorganic. While the desired orientation of the field reactive OLED particulate is maintained by the aligning field, the carrier matrix is hardened to form a hardened support structure within which is locked in position the aligned OLED particulate.

Figure 30:
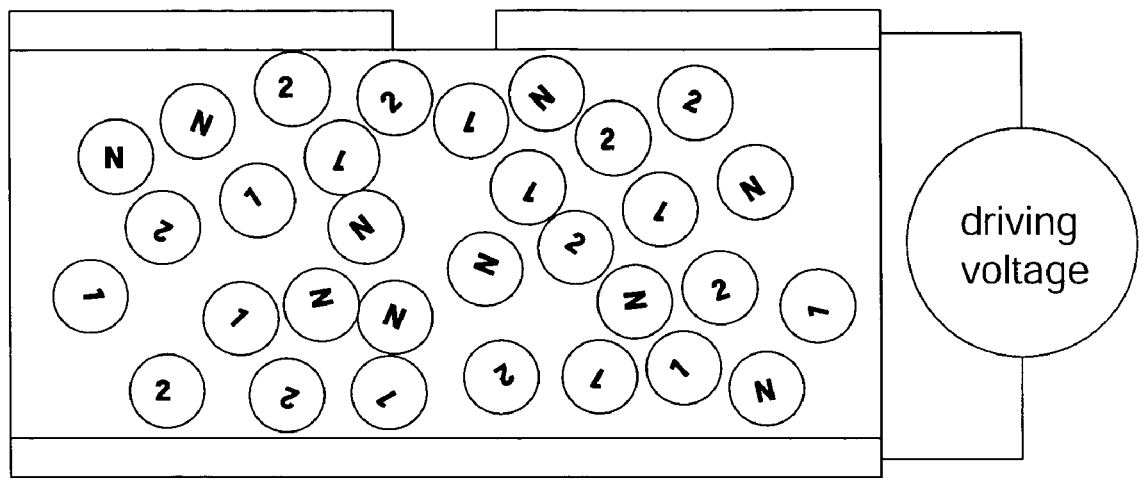
FIG. 30 illustrates an embodiment of the inventive photo-radiation source showing semiconductor particulate and other performance enhancing particulate randomly dispersed within the conductive carrier matrix material.

FIG. 30 illustrates an embodiment of the inventive photo-radiation source showing semiconductor particulate and other performance enhancing particulate randomly dispersed within the conductive carrier matrix material. The semiconductor particulate may comprise an organic light active particulate that includes at least one conjugated polymer. The conjugated polymers having a sufficiently low concentration of extrinsic charge carrier matrix. An electric field applied between the first and second contact layers causes holes and electrons to be injected into the semiconductor particulate through the conductive carrier matrix material. For example, the second contact layer becomes positive relative to the first contact layer and charge carrier matrix of opposite polarity is injected into the semiconductor particulate. The opposite polarity charge carrier matrix combine to form in the conjugated polymer charge carrier matrix pairs or excitons, which emit radiation in the form of light energy.

Depending on the desired mechanical, chemical, electrical and optical characteristics of the photo-radiation source, the conductive carrier matrix material can be a binder material with one or more characteristic controlling additives. For example, the binder material may be a cross-linkable monomer, or an epoxy, or other material into which the semiconductor particulate can be dispersed. The characteristic controlling additives may be in a particulate and/or a fluid state within the binder. The characteristic controlling additives may include, for example, a desiccant, a scavenger, a conductive phase, a semiconductor phase, an insulative phase, a mechanical strength enhancing phase, an adhesive enhancing phase, a hole injecting material, an electron injecting material, a low work metal, a blocking material, and an emission enhancing material. A particulate, such as an ITO particulate, or a conductive metal, semiconductor, doped inorganic, doped organic, conjugated polymer, or the like can be added to control the conductivity and other electrical, mechanical and optical characteristics. Color absorbing dyes can be included to control the output color from the device. Florescent and phosphorescent components can be incorporated. Reflective material or diffusive material can be included to enhance the absorption of received light (in the case, for example, of a display or photodetector) or enhance the emitted light qualities. In the case of a solar collector, the random dispersal orientation of the particulate may be preferred because it will enable a solar cell to have light receiving particulate that are randomly oriented and the cell can receive light from the sun efficiently as it passes over head. The orientation of the particulate may also be controlled in a solar cell to provide a bias for preferred direction of capture light.

The characteristic controlling additives may also include materials that act as heat sinks to improve the thermal stability of the OLED materials. The low work metal additives can be used so that more efficient materials can be used as the electrodes. The characteristic controlling additives can also be used to improve the mobility of the carrier matrix in the organic materials and help improve the light efficiency of the light-emitting device.

Figure 31:
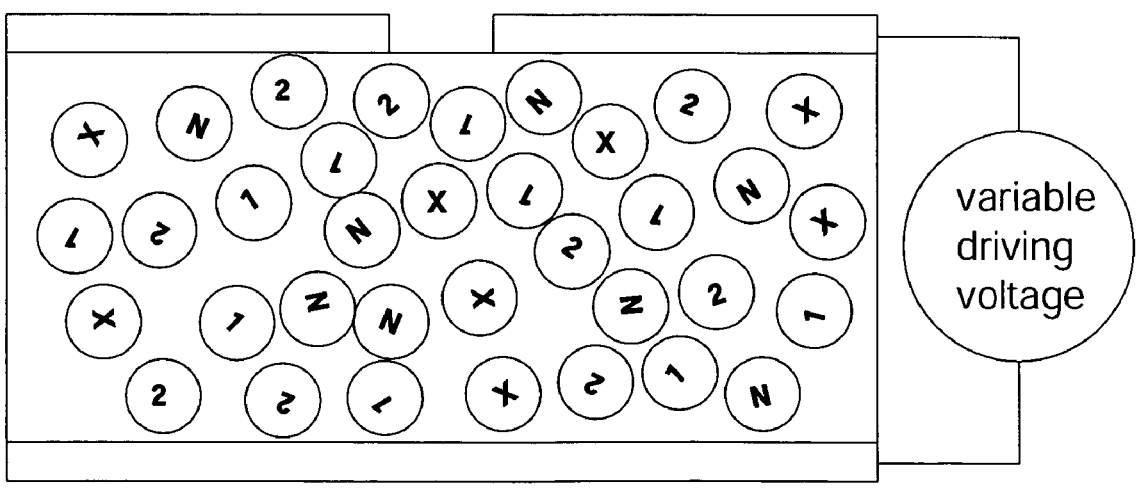
FIG. 31 illustrates an embodiment of the inventive photo-radiation source showing different species of organic light active particulate dispersed within a carrier matrix material.

FIG. 31 illustrates an embodiment of the inventive photo-radiation source showing different species of organic light active particulate dispersed within a carrier matrix material. The turn-on voltage for each species can be different in polarity and/or magnitude. Emissions of different wavelengths or colors can be obtained from a single layer of the mixture of the organic light active particulate and carrier matrix material. The color, duration and intensity of the emission is thus dependent on the controlled application of an electric field to the electrodes. This structure has significant advantages over other full color or multicolor light devices, and can also be configured as a wide spectrum photodetector for applications such as cameras. The organic light active particulate can include organic and inorganic particle constituents including at least one of hole transport material, organic emitters, electron transport material, magnetic and electrostatic material, insulators, semiconductors, conductors, and the like. As is described herein, a multi-layered organic light active particulate can be formed so that its optical, chemical, mechanical and electrical properties are controlled by the various particle constituents.

Figure 32:
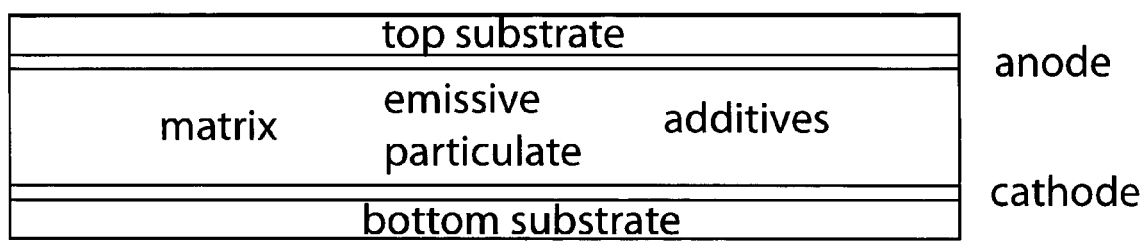
FIG. 32 schematically illustrates the cross-section of an embodiment of the inventive photo-radiation source.

FIG. 32 schematically illustrates the cross-section of an embodiment of the inventive photo-radiation source. The inventive photo-radiation source for the selective polymerization of photo-radiation-curable organic material includes a first electrode, and a second electrode disposed adjacent to the first electrode and defining a gap therebetween. The electrodes are disposed on top and bottom substrates, respectively. The substrates may be a flexible material, such as polyester, PAN, or the like. One substrate may be transparent while the other is reflective.

A photo-radiation emission layer is disposed in the gap. The photo-radiation emission layer includes a charge-transport matrix material and an emissive particulate dispersed within the charge-transport matrix material. The emissive particulate receives electrical energy through the charge-transport matrix material. The energy is applied as a voltage to the first electrode, which may be an anode, and the second electrode, which may be a cathode. The emissive particulate generates photo-radiation in response to the applied voltage. This photo-radiation is effective for the selective polymerization of photo-radiation curable organic material.

In accordance with the present invention, a photo-radiation source is obtained that is effective for the photo-polymerization of a polymerizable organic material. The charge-transport matrix material may be an ionic transport material, such as a fluid electrolyte or a solid electrolyte, including a solid polymer electrolyte (SPE). The solid polymer electrolyte may be a polymer electrolyte including at least one of a polyethylene glycol, a polyethylene oxide, and a polyethylene sulfide. Alternatively or additionally, the charge-transport matrix material may be an intrinsically conductive polymer. The intrinsically conductive polymer may include aromatic repeat units in a polymer backbone. The intrinsically conductive polymer may be, for example, a polythiophene.

The charge-transport matrix material can be transparent to photo-radiation in a photo-radiation spectrum effective for the selective polymerization of photo-radiation-curable organic material. The photo-radiation spectrum may comprise a range between and including UV and blue light. The photo-radiation spectrum may include a range between and including 365 and 405 nm. In a specific embodiment of the invention, the photo-radiation spectrum emitted from the photo-radiation source is in a range centered at around 420 nm.

The charge transport material transports electrical charges to the emissive particulate when a voltage is applied to the first electrode and the second electrode. These charges are cause the emission of photo-radiation from the emissive particulate, this photo-radiation being effective for the selective polymerization of photo-radiation-curable organic material.

The emissive particulate is capable of emitting photo-radiation in a photo-radiation spectrum effective for the selective polymerization of photo-radiation-curable organic material. The photo-radiation spectrum may comprise a range between and including UV and blue light. The photo-radiation spectrum may include a range between and including 365 and 405 nm. In a specific embodiment of the invention, the photo-radiation spectrum emitted from the emissive particulate is in a range centered at around 420 nm.

One of the first and the second electrode can be transparent to at least of portion of photo-radiation emitted by the emissive particulate and the other of the first and the second electrode can be reflective of said at least a portion of the photo-radiation emitted by the emissive particulate.

The emissive particulate may comprise a semiconductor material, such as an organic and/or an inorganic multilayered semiconductor material. The semiconductor particulate can include an organic light active particulate including at least one conjugated polymer. The conjugated polymer has a sufficiently low concentration of extrinsic charge carriers so that on applying an electric field between the first and second contact layers to the semiconductor particulate through the conductive carrier material the second contact layer becomes positive relative to the first contact layer and charge carriers of said first and second types are injected into the semiconductor particulate. The charge carriers combine to form in the conjugated polymer charge carrier pairs which decay radiatively so that radiation is emitted from the conjugated polymer. The organic light active particulate may comprise particles including at least one of hole transport material, organic emitters, and electron transport material.

The organic light active particulate may comprise particles including a polymer blend, the polymer blend including an organic emitter blended with at least one of a hole transport material, an electron transport material and a blocking material. The organic light active particulate may comprise microcapsules including a polymer shell encapsulating an internal phase comprised of a polymer blend including an organic emitter blended with at least one of a hole transport material, an electron transport material and a blocking material.

The conductive carrier material may comprise a binder material with one or more characteristic controlling additives. The characteristic controlling additives are at least one of a particulate and a fluid include a desiccant; a conductive phase, a semiconductor phase, an insulative phase, a mechanical strength enhancing phase, an adhesive enhancing phase, a hole injecting material, an electron injecting material, a low work metal, a blocking material, and an emission enhancing material.

Figure 33:
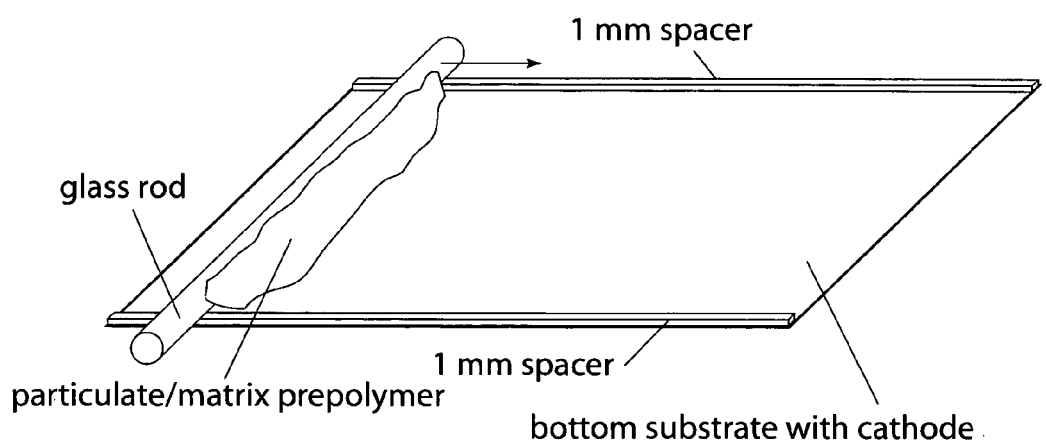
FIG. 33 illustrates a step in an embodiment of the inventive method of making a photo-radiation source, showing the step of the addition of an emissive particulate/matrix mixture onto a bottom substrate with bottom electrode.

FIG. 33 illustrates a step in an embodiment of the inventive method of making a photo-radiation source. In this step, an emissive particulate/matrix mixture is applied onto a bottom substrate with bottom electrode. The particulate/matrix mixture can be applied onto surface of the bottom electrode through a slot-die coating stage, or as shown herein, using a glass rod. At least one of the first electrode and the second electrode may be transparent to photo-radiation in a photo-radiation spectrum effective for the selective polymerization of photo-radiation-curable organic material. The first electrode and the second electrode can be planar and disposed on flexible substrates.

Figure 34:
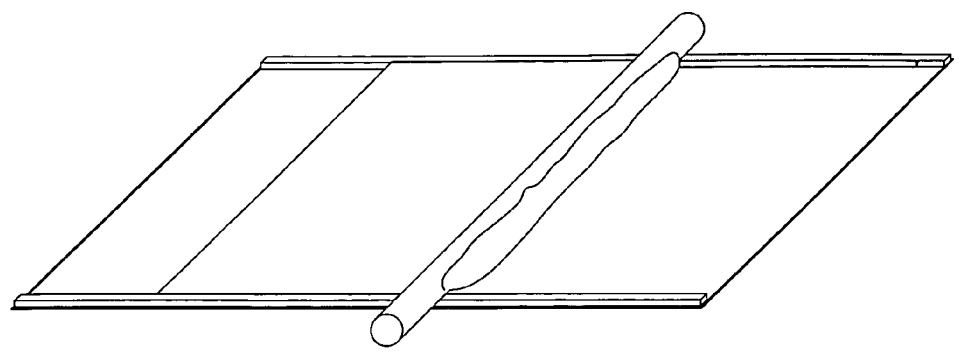
FIG. 34 illustrates a step in the inventive method of making a photo-radiation source, showing the step of uniformly spreading the emissive particulate/matrix mixture onto the bottom electrode.

FIG. 34 illustrates a step in the inventive method of making a photo-radiation source, showing the step of uniformly spreading the emissive particulate/matrix mixture onto the bottom electrode. In this case, the glass rod is pulled across the surface of the bottom electrode to spread a uniformly thick layer of the emissive particulate/matrix material. Spacers may be provided along the edges of the bottom electrode to promote the uniformity of the spread mixture layer.

Figure 35:
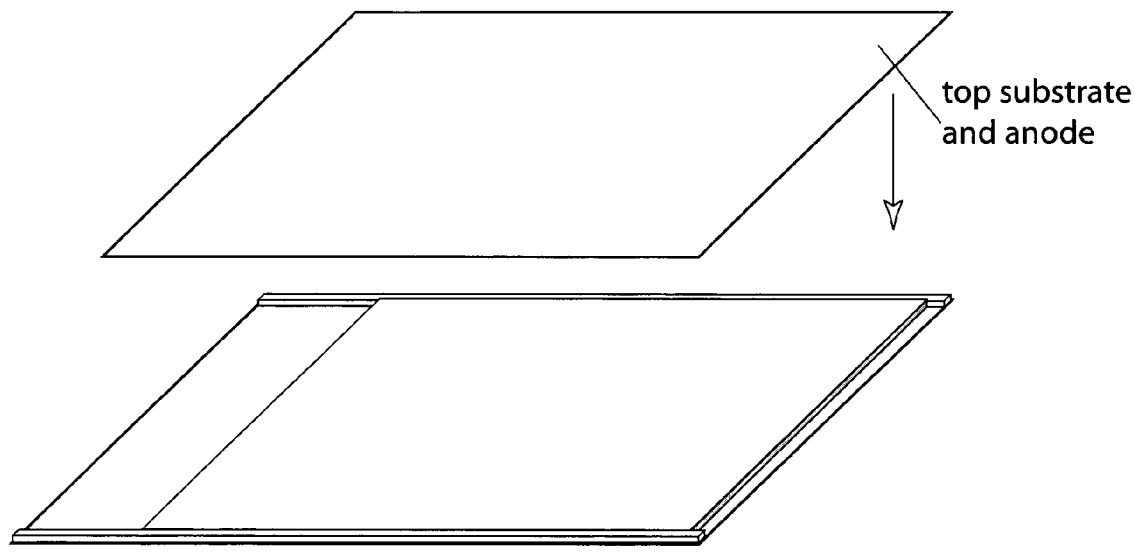
FIG. 35 illustrates a step in the inventive method of making a photo-radiation source, showing the addition of a transparent top substrate with transparent top electrode over the emissive particulate/matrix mixture.

FIG. 35 illustrates a step in the inventive method of making a photo-radiation source, showing the addition of a transparent top substrate with transparent top electrode over the emissive particulate/matrix mixture. At least one of the first electrode and the second electrode may be transparent to photo-radiation in a photo-radiation spectrum effective for the selective polymerization of photo-radiation-curable organic material. The first electrode and the second electrode can be planar and disposed on flexible substrates. The top substrate and the top electrode may be transparent, with the electrode material being indium tin oxide, a conjugated polymer, or other transparent conductor. The top substrate material can be polyester, glass or other transparent substrate material.

Figure 36:
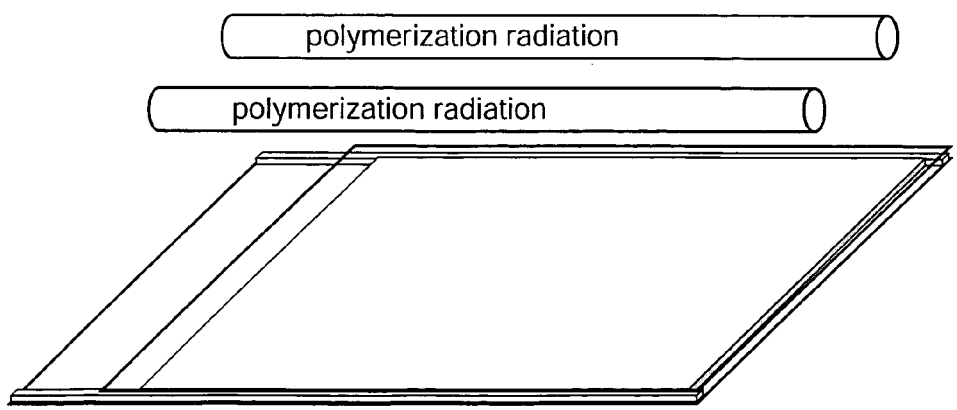
FIG. 36 illustrates a step in the inventive method of making a photo-radiation source, showing the step of photo-curing the matrix to form a solid-state emissive particulate/hardened matrix on the bottom substrate.

FIG. 36 illustrates a step in the inventive method of making a photo-radiation source, showing the step of photo-curing the matrix to form a solid-state emissive particulate/hardened matrix on the bottom substrate. Once the top substrate and top electrode are in place the matrix material can be hardened to form a solid-state device. The matrix material can be a photo-polymerizable organic material, a two-part system such as a two-part epoxy, a thermally hardenable material, or the like.

Figure 37:
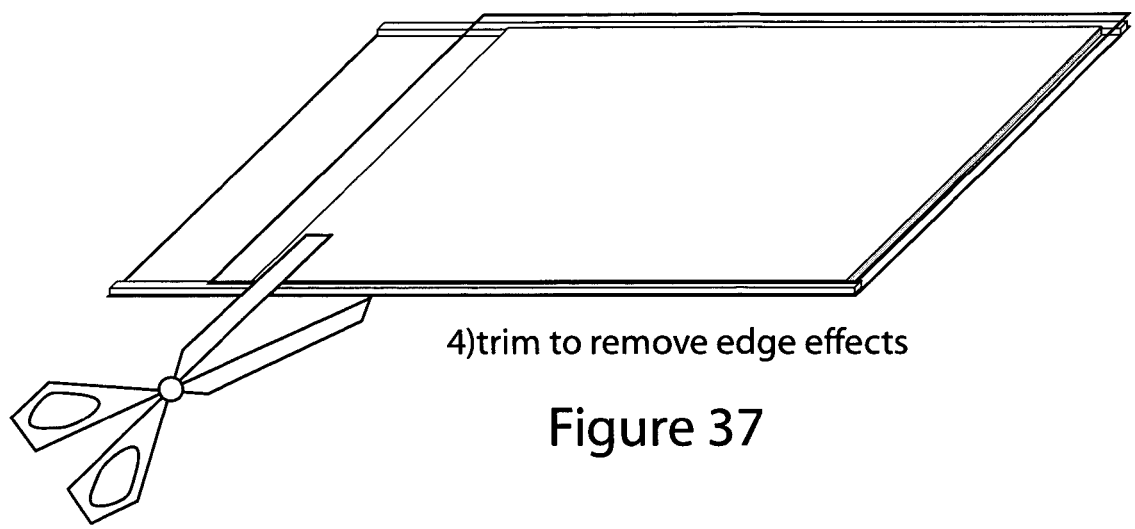
FIG. 37 illustrates a step in the inventive method of making a photo-radiation source, showing the step of trimming the solid-state photo-radiation source sheet.
Figure 38:
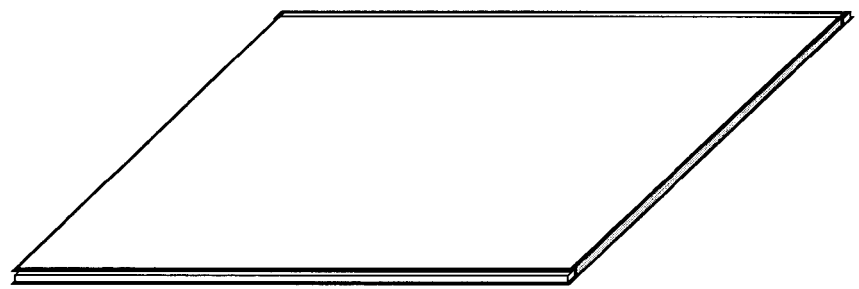
FIG. 38 illustrates the completed solid-state photo-radiation source sheet.
Figure 39:
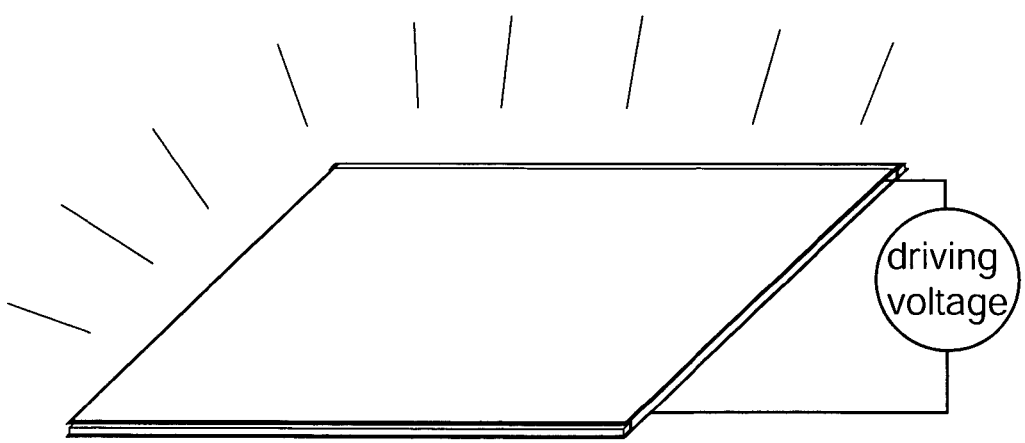
FIG. 39 illustrates the completed solid-state photo-radiation source sheet being driven with a driving voltage to light up.

FIG. 37 illustrates a step in the inventive method of making a photo-radiation source, showing the step of trimming the solid-state photo-radiation source sheet. Once the solid-state device structure has been obtained, the ends and edges can be trimmed as necessary or desired. FIG. 38 illustrates the completed solid-state photo-radiation source sheet and FIG. 39 illustrates the completed solid-state photo-radiation source sheet being driven with a driving voltage to light up.

FIGS. 40-42 illustrate a process for using the completed panel or light sheet of FIG. 38. FIG. 40 shows that a desired shape is cut, stamped or otherwise formed from the light sheet; FIG. 41 shows that the shape (a letter "S") is mounted on a backing board, and FIG. 42 shows that a driving voltage is applied to the shape to cause it to radiate. FIG. 43 shows a sample sign that can be created using the procedure of FIGS. 40-42.

Figure 44:
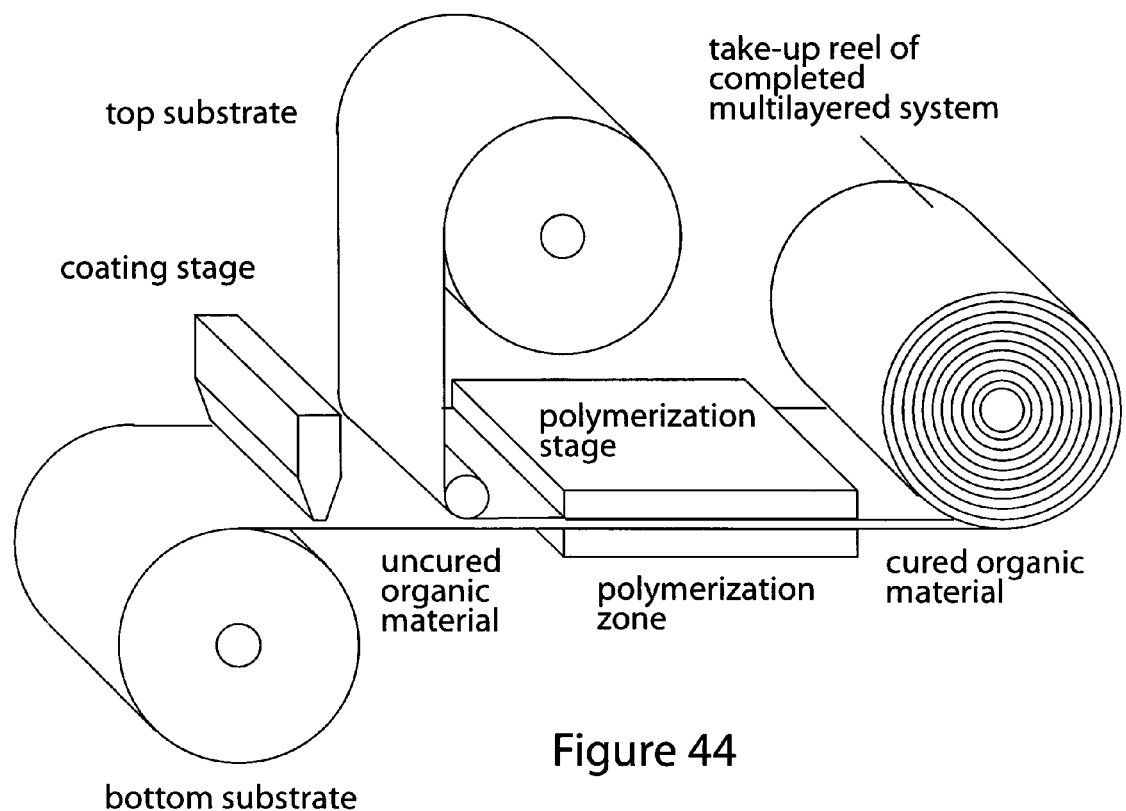
FIG. 44 shows an example of a roll-to-roll manufacturing process utilizing the inventive photo-radiation source for curing a photo-polymerizable organic material disposed between two continuous sheets of top and bottom substrates.
Figure 45:
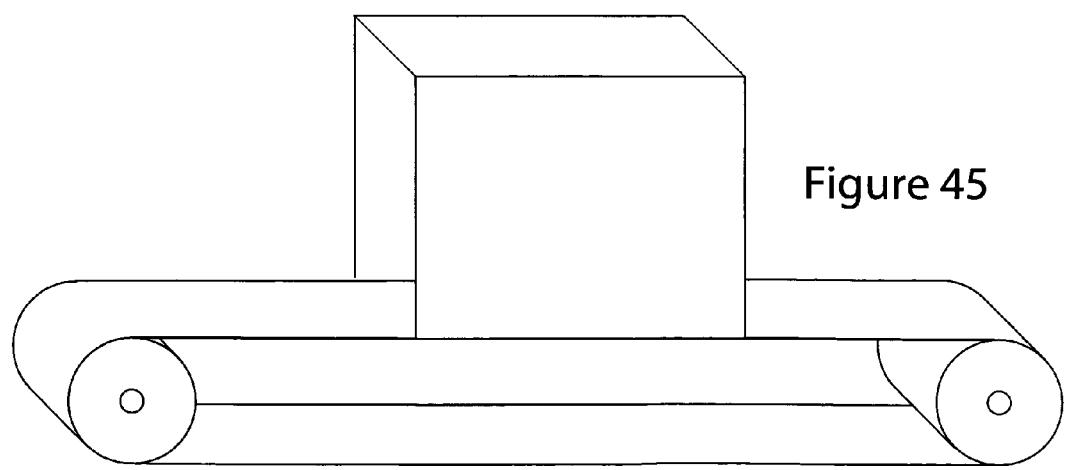
FIG. 45 shows an example of a conveyor continuous processing system utilizing a curing booth having the inventive photo-radiation source.

FIG. 44 shows an example of a roll-to-roll manufacturing process utilizing the inventive photo-radiation source for curing a photo-polymerizable organic material disposed between two continuous sheets of top and bottom substrates. FIG. 45 shows an example of a conveyor continuous processing system utilizing a curing booth having the inventive photo-radiation source. FIG. 46 shows an example of a light-pipe photo-polymerization system having an embodiment of the inventive photo-radiation source.

FIG. 47 shows an example of a three-dimensional scanned curing system having an embodiment of the inventive photo-radiation source. In this case, the inventive photo-radiation source is used to create a focused beam of light. Mirrors are used to scan the light beam over the surface of a pool of light-polymerizable organic material. As the light is scanned over the surface, the organic material that is impinged by the scanned light beam hardens. With each successive two-dimensional scan, the stage is lowered. Over multiple successive beam scanning and stage lowering passes, a three-dimensional solid object is built up.

Figure 48:
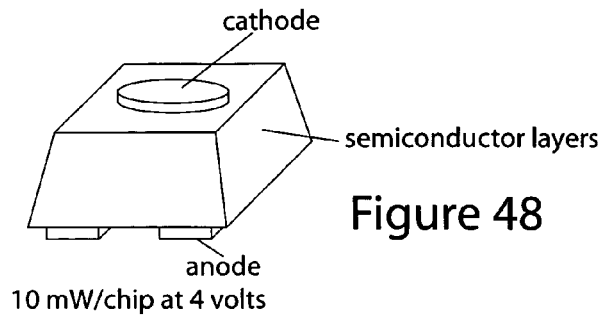
FIG. 48 illustrates a conventional inorganic light emitting diode chip.

FIG. 48 illustrates a conventional inorganic light emitting diode chip. A conventional inorganic light emitting diode chip consists of semiconductor layers disposed between cathode and an anode. When a voltage is applied to the cathode and anode, electrons and holes combine within the semiconductor layers and decay radiatively to produce light.

Figure 49:
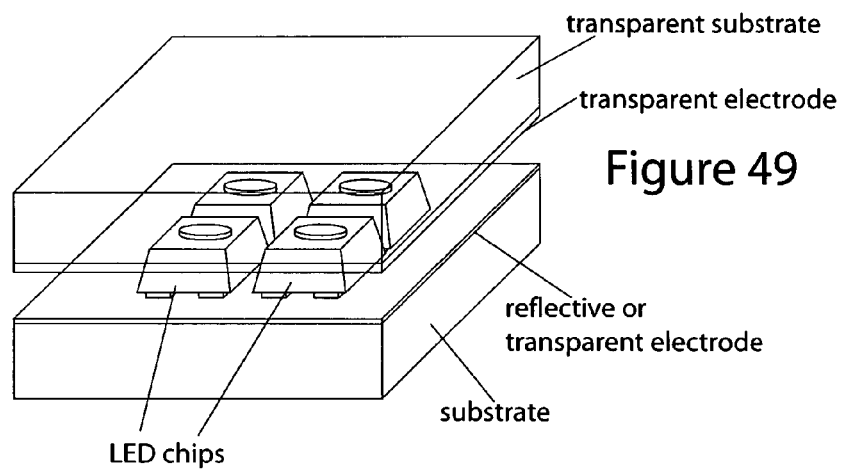
FIG. 49 illustrates an inventive photo-radiation (light active) source or sensor having a formation of light emitting diode chips connected without solder or wire bonding to a common anode and cathode.
Figure 50:
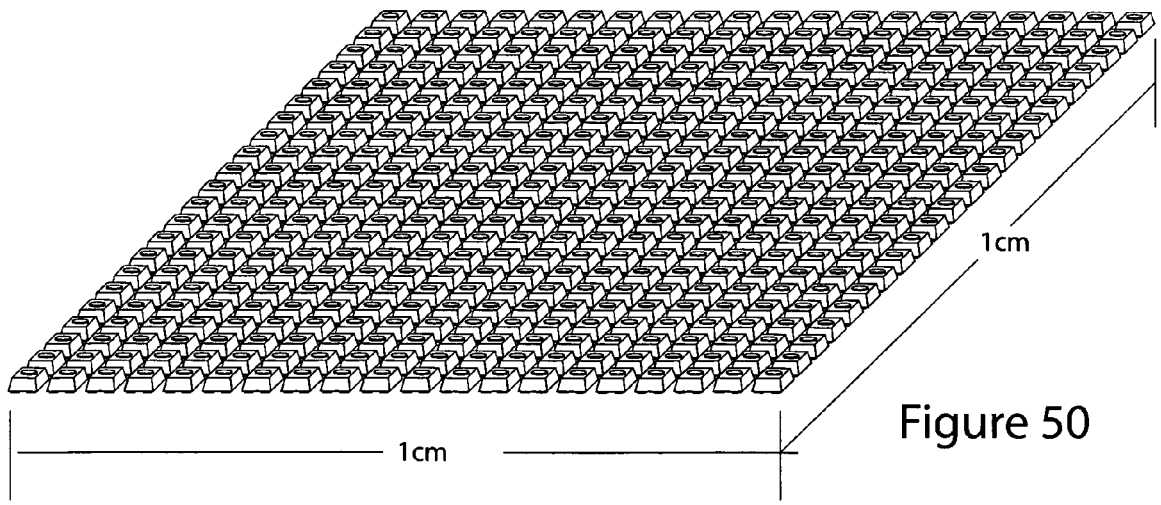
FIG. 50 illustrates the high packing density of the formation of light emitting diode chips obtainable in accordance with an embodiment of the inventive photo-radiation source.

In accordance with the present invention, a photo-radiation source is provided for the selective polymerization of photo-radiation-curable organic material. FIG. 49 illustrates an inventive photo-radiation source having a formation of light emitting diode chips connected without solder or wire bonding to a common anode and cathode. A plurality of light emitting diode chips generates a photo-radiation spectrum effective for the selective polymerization of photo-radiation-curable organic material. Each chip has an anode and a cathode. A first electrode is in contact with each anode of the respective light emitting diode chips. A second electrode is in contact with each cathode of the respective light emitting diode chips. At least one of the first electrode and the second electrode comprises a transparent conductor. FIG. 50 illustrates the high packing density of the formation of light emitting diode chips obtainable in accordance with an embodiment of the inventive photo-radiation source. The plurality of chips can be permanently fixed in a formation by being squeezed between the first electrode and the second electrode without the use of solder or wire bonding. The plurality of chips can be permanently fixed in a formation by being adhered to at least one of the first electrode and the second electrode using an intrinsically conjugated polymer. The intrinsically conjugated polymer may comprise a benzene derivative. The intrinsically conjugated polymer may comprise a polythiophene.

Figure 51:
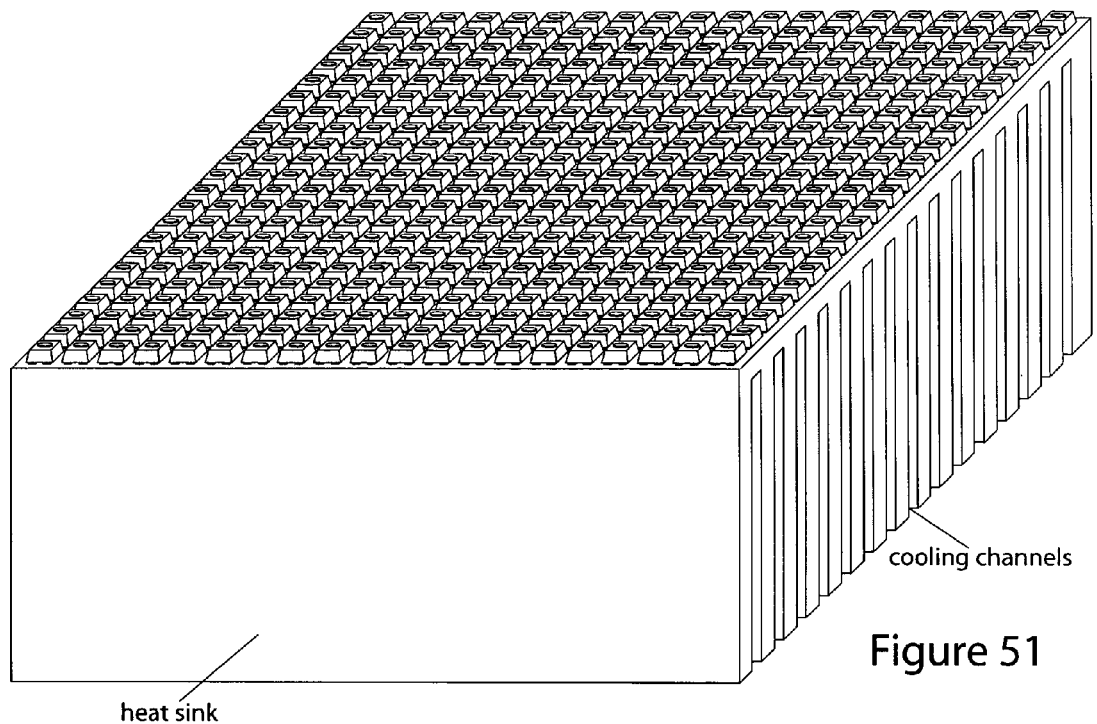
FIG. 51 is an embodiment of the inventive photo-radiation source showing a heat sink electrode base having cooling channels.

FIG. 51 is an embodiment of the inventive photo-radiation source showing a heat sink electrode base having cooling channels. In accordance with this embodiment of the present invention, the bottom electrode can be constructed of a metal, such as aluminum. A cooling system, such as cooling fins can be provided to dissipate heat that is generated when driving the tightly packed formation of inorganic light emitting diode chips. The system can be cooling channels through which a fluid material, such as forced air, water, or other liquid flows. The heated liquid can be passed through a radiator or other system for removing heat from it, and the cooling system can be a self-contained, closed apparatus. By this construction, an extremely high chip packing density is obtained allowing for very high light intensity to be emitted. This very high light intensity enables the effective photo-polymerization of a photo-polymerizable organic material.

The photo-radiation spectrum emitted by the chips may be in a range between and including UV and blue light. The photo-radiation spectrum may include a range between and including 365 and 405 nm. In a specific embodiment of the invention, the photo-radiation spectrum emitted from the chips is in a range centered at around 420 nm.

In accordance with the present invention, a method of making a photo-radiation source is provided. A first planar conductor is provided and a formation of light emitting chips formed on the first planar conductor. Each chip has a cathode and an anode. One of the cathode and anode of each chip is in contact with the first planar conductor. A second planar conductor is disposed on top of the formation of light emitting chips, so that the second planar conductor is in contact with the other of the cathode and anode of each chip. The first planar conductor is bound to the second planar conductor to permanently maintain the formation of light emitting chips. In accordance with the present invention, the formation is maintained, and the electrical contact with the conductors is obtained, without the use of solder or wire bonding for making an electrical and mechanical contact between the chips and either of the first planar conductor and the second planar conductor.

At least one of the first planar electrode and the second planar electrode is transparent. The first planar electrode and the second planar electrode can be bound together by an adhesive disposed between the first and second electrode. The formation of light emitting chips can be fixed to at least one of the first planar electrode and the second planar electrode by a binder material. This binder material may be an intrinsically conductive polymer. The first planar electrode and the second planar electrode can be bound together by the binder material that also fixes the formation of light emitting chips. In accordance with this embodiment of the invention, ultra-high chip packing density is obtained without the need for solder or wire bonding each individual chip.

Figure 52:
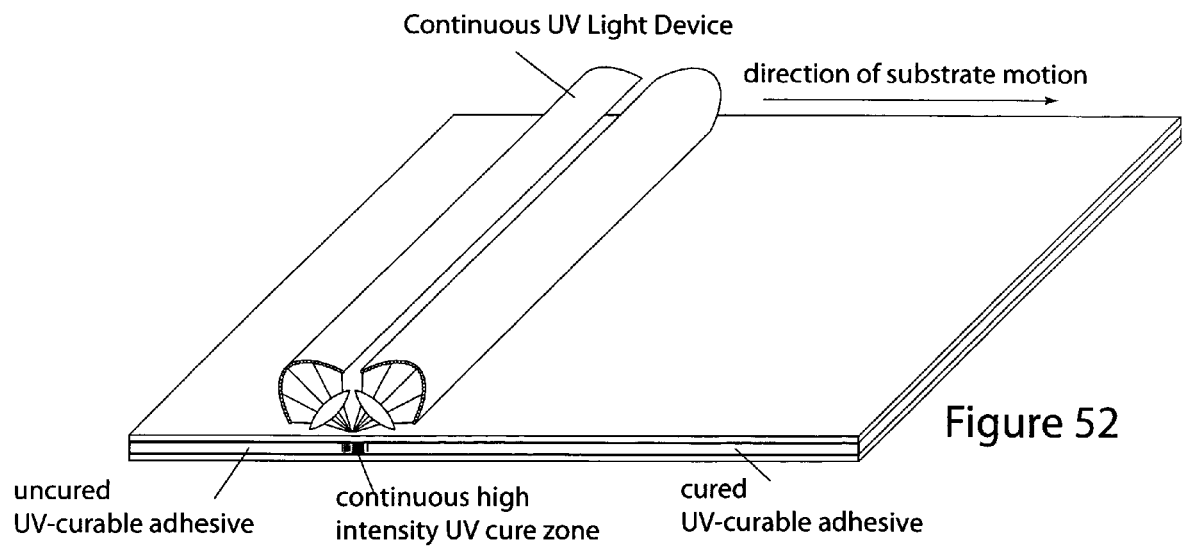
FIG. 52 illustrates an embodiment of the inventive photo-radiation source having a geometry and optical system for concentrating the light output for photo-curing an organic material in a continuous fabrication method.

FIG. 52 illustrates an embodiment of the inventive photo-radiation source having a geometry and optical system for concentrating the light output for photo-curing an organic material in a continuous fabrication method. The curved geometry is obtained by forming the substrates, the first electrode and the second electrode as being planar and flexible. The flexible substrates can thus be shaped into an optical geometry effective for controlling light emitted from the plurality of light emitting diode chips, or for controlling the light emitted from the radiation source light sheet described above.

Figure 57:
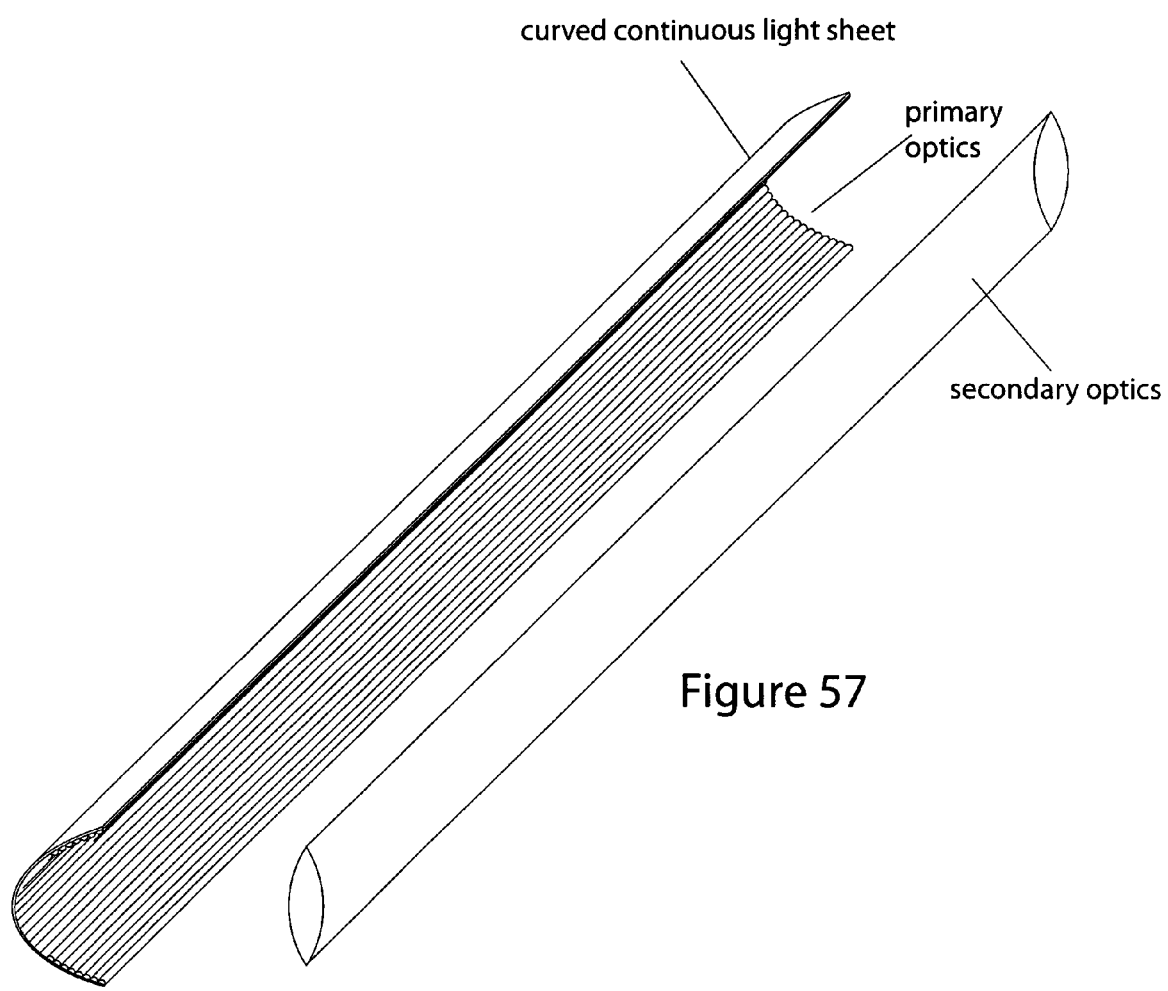
FIG. 57 is a view of the curved light sheet construction having a secondary optical system for controlling the focus of light emission.
Figure 58:
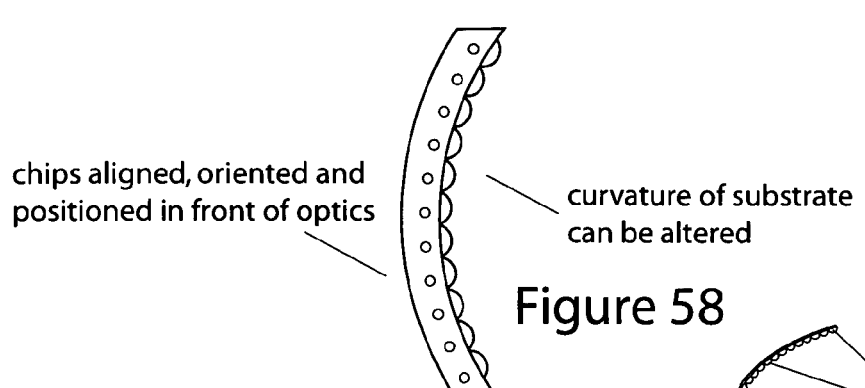
FIG. 58 is a schematic side view showing light emitting diode chips disposed adjacent to respective optical lenses.
Figure 59:
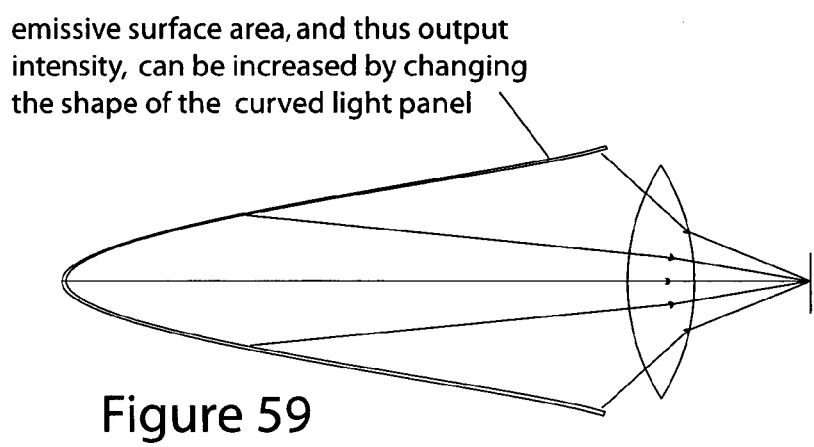
FIG. 59 is a schematic side view showing how the light output intensity can be increased by changing the shape of the curved light sheet construction.
Figure 60:
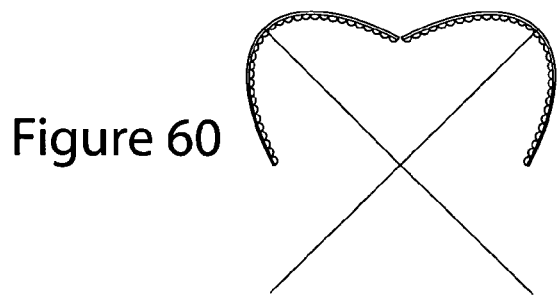
FIG. 60 is a schematic side view showing two curved light sheets having a common light emission focal point.
Figure 61:
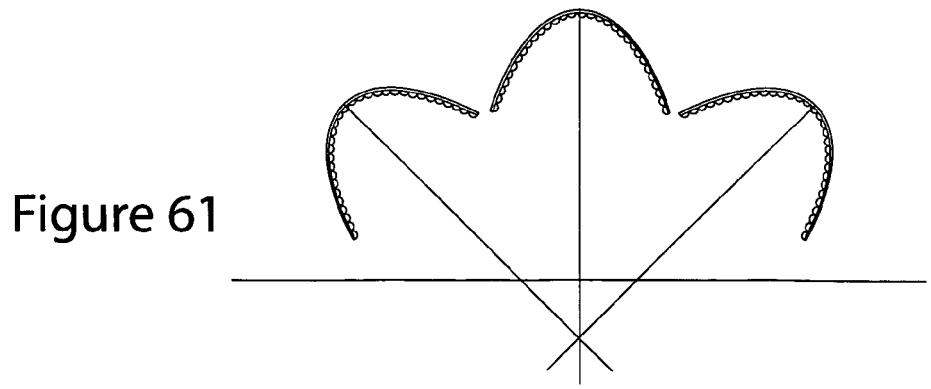
FIG. 61 is a schematic side view showing three curved light sheets having a common light emission focal point.

FIG. 53 shows an isolated view of a substrate with an optical surface for controlling the focus of light emitted from an embodiment of the inventive photo-radiation source. FIG. 54 shows an embodiment of the inventive photo-radiation source having a flat light sheet construction with a top substrate with an optical surface. FIG. 55 shows the inventive photo-radiation source having a curved light sheet construction shaped with a light emission enhancing curvature. FIG. 56 is a schematic side view of the curved light sheet construction illustrating the focal point of light emission. FIG. 57 is a view of the curved light sheet construction having a secondary optical system for controlling the focus of light emission. FIG. 58 is a schematic side view showing light emitting diode chips disposed adjacent to respective optical lenses. FIG. 59 is a schematic side view showing how the light output intensity can be increased by changing the shape of the curved light sheet construction. FIG. 60 is a schematic side view showing two curved light sheets having a common light emission focal point. FIG. 61 is a schematic side view showing three curved light sheets having a common light emission focal point. As shown in these drawings, at least one of the flexible substrates can include a first optical system associated with it for controlling light emitted from the plurality of light emitting diode chips. A second optical system can be disposed adjacent to one of the substrates for controlling light emitted from the plurality of light emitting diode chips.

FIG. 62 is cross-sectional block diagram showing the constituent parts of the inventive light active sheet. In accordance with an embodiment of the inventive light active sheet, a top PET substrate has a coating of ITO, acting as the top electrode. A bottom PET substrate can be ITO PET, metal foil, metalized mylar, etc., depending on the intended application of the light sheet (e.g., transparent HUD element, light source, solar panel, etc.). The matrix (carrier) material may be a transparent photopolymerizable solid polymer electrolyte (SPE) based on cross-linked polysiloxane-g-oglio9ethylene oxide (see, for example, Solid polymer electrolytes based on cross-linked polysiloxane-g-oligo (ethylene oxide): ionic conductivityand electrochemical properties, Journal of Power Sources 119-121 (2003) 448-453, which is incorporated by reference herein). The emissive particulate may be commercially available LED chips, such as an AlGaAs/AlGaAs Red LED Chip—TK 112UR, available from Tyntek, Taiwan). Alternatively the particulate may be comprised of light-to-energy particles, having charge donor and charge acceptor semiconductor layers, such as found in typical silicon-based solar panels. In the case of an energy-to-light device (i.e., a light sheet), it may be preferable for the matrix material to be less electrically conductive than the semiconductor elements so that the preferred path of electrical conductivity is through the light emitting elements. In the case of a light-to-energy device (i.e., a solar panel), it may be preferable for the matrix material to be more electrically conductive than the semiconductor element so that charges separated at the donor/acceptor interface effectively migrate to the top and bottom substrate electrodes.

FIG. 63 is a cross-section block diagram of an embodiment of the inventive light active sheet having a cross-linked polymer (e.g., polysiloxane-g-oglio9ethylene oxide) matrix, UV semiconductor elements, and phosphor re-emitter. In this case, a white-light solid-state light sheet is obtained through the stimulated re-emission of light in the visible sprectrum via UV stimulation of a phosphore re-emitter additive dispersed in the matrix between the substrates. In this case, the UV semiconductor elements may be LED chips (for example, UV LED chips C405-MB290-S0100, available from Cree of North Carolina) and the phosphor may be a YAG (yttrium aluminum garnet) phosphor.

FIG. 64 is a cross-sectional block diagram of an embodiment of the inventive light active sheet having a light diffusive and/or re-emitter coating on a transparent substrate. In accordance with this embodiment, the additives in the matrix may be, for example, light diffusers, adhesive enhancers, matrix conductivity enhancers, etc. The re-emitter coating can be a YAG phosphor coating (with a multi-layered substrate). Further, the light diffusion can be obtained through the substrate composition or through substrate surface effects, such as calendaring.

FIG. 65 is a cross-sectional block diagram of an embodiment of the inventive light active sheet having blue and yellow semiconductor elements, and light diffusers (e.g., glass beads) within the matrix. The blue and yellow semiconductor elements can be LED chips that are selected to create a white light emission, or an RGB combination.

Figure 66:
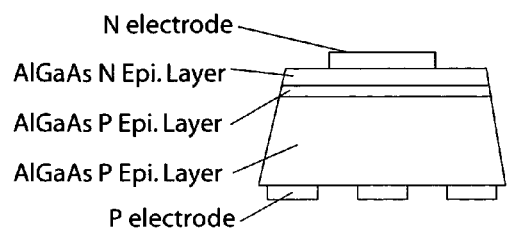
FIG. 66 is a side view of a commercially available inorganic LED chip.
Figure 67:
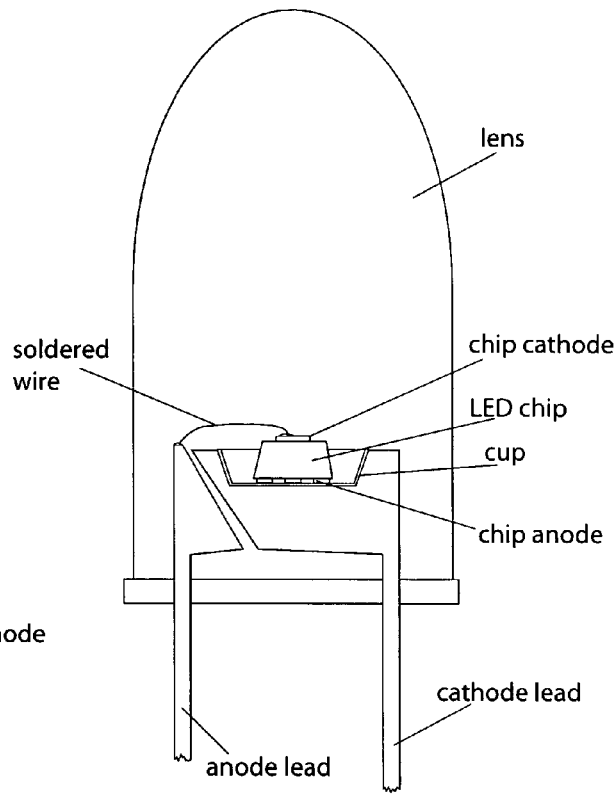
FIG. 67 is a cross-sectional view of a conventional LED lamp.

FIG. 66 is a side view of a commercially available inorganic LED chip. A conventional inorganic LED chip is available from many manufacturers, typically has a relatively narrow radiation emission spectrum, is relatively energy efficient, has a long service life and is solid-state and durable. The chip shown is an example of an AlGaAs/AlGaAs red chip, obtained from Tyntek Corporation, Taiwan. These chips have dimensions roughly 12 mil×12 mil×8 mil, making them very small point light sources. As shown in FIG. 67, in a conventional LED lamp, this chip is held in a metal cup so that one electrode of the chip (e.g., the anode) is in contact with the base of the cup. The metal cup is part of a cathode lead. The other electrode of the chip (e.g., the cathode) has a very thin wire solder or wire bonded to it, with the other end of the wire solder or wire bonded to an anode lead. The cup, chip, wire and portions of the anode and cathode leads are encased in a plastic lens with the anode and cathode leads protruding from the lens base. These leads are typically solder or wire bonding to a circuit board to selectively provide power to the chip and cause it to emit light. It is very difficult to manufacture these conventional lamps due to the very small size of the chip, and the need to solder or wire bond such a small wire to such a small chip electrode. Further, the plastic lens material is a poor heat conductor and the cup provides little heat sink capacity. As the chip heats up its efficiency is reduced, limiting the service conditions, power efficiency and light output potential of the lamp. The bulkiness of the plastic lens material and the need to solder or wire bond the lamp leads to an electrical power source limits emissive source packing density and the potential output intensity per surface area.

Figure 68:
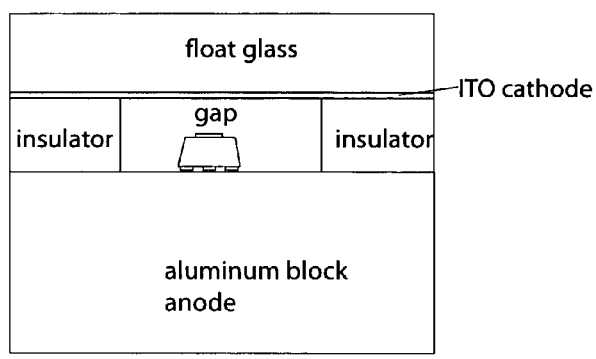
FIG. 68 is a cross-sectional view of an experimental prototype of the inventive photo-radiation source having a gap between the N electrode of an LED chip and an ITO cathode.

FIG. 68 is a cross-sectional view of an experimental prototype of the inventive photo-radiation source having a gap between the N electrode of an LED chip and an ITO cathode. When voltage is applied to the aluminum anode and the ITO cathode, the air gap between the N electrode and the ITO prevents electricity from getting to the chip.

Figure 69:
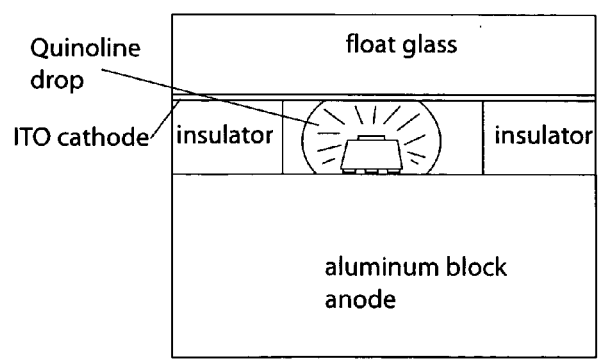
FIG. 69 is a cross-sectional view of the experimental prototype of the inventive photo-radiation source having a drop of quinoline as a conductive matrix material completing the electrical contact between the N electrode of the LED chip and the ITO cathode.

FIG. 69 is a cross-sectional view of the experimental prototype of the inventive photo-radiation source having a drop of quinoline as a conductive matrix material completing the electrical contact between the N electrode of the LED chip and the ITO cathode. When voltage is applied to the aluminum anode and the ITO cathode, the quinoline completes the electrical connection, and the chip lights up brightly. This inventive device structure allows a connection that does not require solder or wire bonding between the chip and the current source from the anode and cathode electrodes (the ITO and the aluminum). The aluminum block acts as an effective heat sink, and the quinoline surrounding the chip provides very efficient heat transfer from the chip to the aluminum block. The result is that the chip can be driven at higher voltage and bright intensity. Also, since the connection to the chip does not require a tedious and expensive solder or wire bonding operation, it is much easier to fabricate the inventive structure than the conventional LED lamp construction (shown, for example, in FIG. 67). Further, the avoidance of solder or wire bonding connections directly to the chip, and the heat transfer and dissipation provided by the conductive medium and the metallic heat sink, allows for extremely high chip packing densities to be realized (as shown, for example, in FIG. 51). The result is an effective photo-radiation source having superior radiation intensity, durability, lifetime, cost and spectrum as compared with any of the conventional art.

Figure 70:
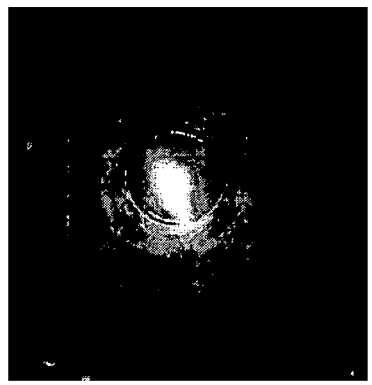
FIG. 70 is a photograph of an experiment prototype demonstrating a light active particle (LED chip) connected to a top and/or bottom electrode through a charge transport material (quinoline)

FIG. 70 is a photograph of an experiment prototype demonstrating a light active particle (LED chip) connected to a top and/or bottom electrode through a charge transport material (quinoline). This photograph shows a conventional LED chip suspended in a drop of quinoline, a benzene derivative. The quinoline drop and LED chip are disposed between a top and bottom conductive substrate comprised of ITO-coated float glass. When voltage is applied to the respective top and bottom conductors (the ITO), the electrical connection to the chip is made through the quinoline, and the chip brightly lights up.

Figure 71:
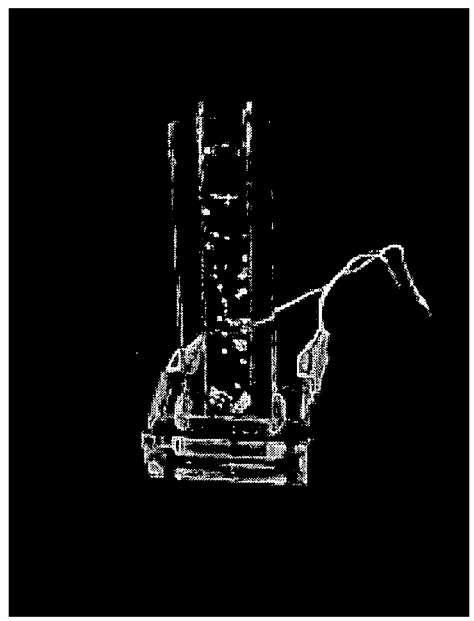
FIG. 71 is a photograph of an experimental prototype demonstrating a free-floating light emissive particulate (miniature LED lamps) dispersed within a conductive fluid carrier (salt-doped polyethylene oxide)

FIG. 71 is a photograph of an experimental prototype demonstrating a free-floating light emissive particulate (miniature LED lamps) dispersed within a conductive fluid carrier (salt-doped polyethylene oxide). An emissive particulate/conductive carrier concept was demonstrated and proven viable using very small "particulated" inorganic LEDs suspended in an ionic conducting fluid composed of a fluid poly(ethylene glycol) (PEG) polymer doped with a room temperature molten salt. When connected to 110 v AC, these 3 v DC devices light up without burning out.

Figure 72:
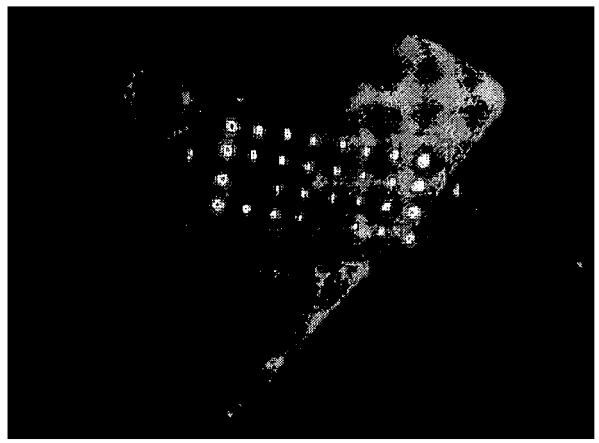
FIG. 72 is a photograph of an experiment prototype demonstrating an 8×4 element grid of light active semiconductor elements (LED chips) disposed between ITO-coated glass substrates.

FIG. 72 is a photograph of an experiment prototype demonstrating an 8×4 element grid of light active semiconductor elements (LED chips) disposed between ITO-coated glass substrates. This photograph shows a light sheet prototype comprised of an array of 32 inorganic light emitting diode chips, each chip is about the size of a fine grain of salt. Unlike conventional LED lamps (shown, for example, in FIG. 67), in accordance with the present invention, there are no solder or wires connecting the LED chips to the power source. By avoiding the need for solder and wiring, the present invention provides a considerable cost savings as compared with the existing technologies. The inventive light sheet also has a unique, ultra-thin form factor and full spectrum of colors (including high brightness white light).

With respect to the above description, it is realized that the optimum dimensional relationships for parts of the invention, including variations in size, materials, shape, form, function, and manner of operation, assembly and use, are deemed readily apparent and obvious to one skilled in the art. All equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described. Accordingly, all suitable modifications and equivalents may be resorted to, falling within the scope of the invention.

The invention claimed is:

1. A photo-radiation source, comprising:
   a first electrode;
   a second electrode disposed adjacent to the first electrode and defining a gap therebetween; and
   a photo-radiation emission layer disposed in the gap, the photo-radiation emission layer comprising a charge-transport matrix material and an emissive particulate dispersed within the charge-transport matrix material, the emissive particulate receiving electrical energy through the charge-transport matrix material applied as a voltage to the first electrode and the second electrode photo-radiation, the emissive particulate generating photo-radiation in response to the applied voltage; wherein the charge-transport matrix material comprises a conductive material.

2. A photo-radiation source according to claim 1; wherein the charge-transport matrix material comprises an ionic transport material.

3. A photo-radiation source according to claim 2; wherein the ionic transport material comprises an electrolyte.

4. A photo-radiation source according to claim 3; wherein the electrolyte is a solid polymer electrolyte.

5. A photo-radiation source according to claim 4; where the solid polymer electrolyte comprises a polymer electrolyte including at least one of a polyethylene glycol, a polyethylene oxide, and a polyethylene sulfide.

6. A photo-radiation source according to claim 1; wherein the charge-transport matrix material comprises an intrinsically conductive polymer.

7. A photo-radiation source according to claim 6; wherein the intrinsically conductive polymer comprises aromatic repeat units in a polymer backbone.

8. A photo-radiation source according to claim 1; wherein the intrinsically conductive polymer comprises a polythiophene.

9. A photo-radiation source according to claim 8; wherein the photo-radiation spectrum comprises a range between and including UV and blue light.

10. A photo-radiation source according to claim 8; wherein the photo-radiation spectrum comprises a range between and including 365 and 405 nm.

11. A photo-radiation source according to claim 8; wherein the photo-radiation spectrum comprises a range including 420 nm.

12. A photo-radiation source according to claim 9; wherein the photo-radiation spectrum comprises a range between and including UV and blue light.

13. A photo-radiation source according to claim 9; wherein the photo-radiation spectrum comprises a range between and including 365 and 405 nm.

14. A photo-radiation source according to claim 9; wherein the photo-radiation spectrum comprises a range including 420 nm.

15. A photo-radiation source according to claim 1; wherein the charge-transport matrix material is transparent to photo-radiation in a photo-radiation spectrum effective for the selective polymerization of a photo-radiation-curable organic material.

16. A photo-radiation source according to claim 15; wherein the photo-radiation spectrum comprises a range between and including UV and blue light.

17. A photo-radiation source according to claim 1; wherein the photo-radiation spectrum comprises a range between and including 365 and 405 nm.

18. A photo-radiation source according to claim 1; wherein the photo-radiation spectrum comprises a range including 420 nm.

19. A photo-radiation source according to claim 1; wherein at least one of the first electrode and the second electrode is transparent to photo-radiation in a photo-radiation spectrum effective for the selective polymerization of a photo-radiation-curable organic material.

20. A photo-radiation source according to claim 1; wherein the first electrode and the second electrode are planar and disposed on flexible substrates.

21. A photo-radiation source according to claim 1; wherein the charge transport material is effective for transporting electrical charges to the emissive particulate when a voltage is applied to the first electrode and the second electrode, said charges being effective for causing the emission of photo-radiation from the emissive particulate.

22. A photo-radiation source according to claim 1; wherein the emissive particulate are capable of emitting photo-radiation in a photo-radiation spectrum effective for the selective polymerization of a photo-radiation-curable organic material.

23. A photo-radiation source according to claim 1; wherein one of the first and the second electrode is transparent to at least of portion of photo-radiation emitted by the emissive particulate and the other of the first and the second electrode is reflective of said at least a portion of the photo-radiation emitted by the emissive particulate.

24. A photo-radiation source according to claim 1; wherein the emissive particulate comprises a semiconductor material.

25. A photo-radiation source according to claim 1; wherein the emissive particulate comprises at least one of an organic and an inorganic multilayered semiconductor particulate.

26. A photo-radiation source according to claim 1; wherein the emissive particulate comprises at least one of an organic and an inorganic semiconductor.

27. A photo-radiation source according to claim 1; wherein the emissive particulate comprises an organic light active particulate including at least one conjugated polymer, said at least one conjugated polymer having a sufficiently low concentration of extrinsic charge carriers so that on applying an electric field between the first and second electrodes to the emissive particulate through the charge transport matrix the second contact layer becomes positive relative to the first contact layer and charge carriers of said first and second types are injected into the emissive particulate and combine to form in the conjugated polymer charge carrier pairs which decay radiatively so that radiation is emitted from the conjugated polymer.

28. A photo-radiation source according to claim 27; wherein the organic light active particulate comprises particles including at least one of hole transport material, organic emitters, and electron transport material.

29. A photo-radiation source according to claim 27; wherein the organic light active particulate comprises particles including a polymer blend, the polymer blend including an organic emitter blended with at least one of a hole transport material, an electron transport material and a blocking material.

30. A photo-radiation source according to claim 29; wherein the organic light active particulate comprises microcapsules including a polymer shell encapsulating an internal phase comprised of a polymer blend including an organic emitter blended with at least one of a hole transport material, an electron transport material and a blocking material.

31. A photo-radiation source according to claim 29; wherein the charge transport matrix comprises a binder material with one or more characteristic controlling additives.

32. A photo-radiation source according to claim 31; wherein the characteristic controlling additives are at least one of a particulate and a fluid include a desiccant; a conductive phase, a semiconductor phase, an insulative phase, a mechanical strength enhancing phase, an adhesive enhancing phase, a hole injecting material, an electron injecting material, a low work metal, a blocking material, and an emission enhancing material.

* * * * *